US011735607B2

United States Patent
Joe et al.

(10) Patent No.: US 11,735,607 B2
(45) Date of Patent: Aug. 22, 2023

(54) IMAGE SENSOR INCLUDING COLOR FILTER GRID INCLUDING PORTION OVERLAPPING SUPER PHASE DETECTION (PD) PIXEL

(71) Applicant: SAMSUNG ELECTRONICS CO., LTD., Suwon-si (KR)

(72) Inventors: In Sung Joe, Seoul (KR); Min Kyung Kim, Yongin-si (KR); Min Kwan Kim, Hwaseong-si (KR); Ji Su Kim, Hwaseong-si (KR); Tae Hoon Kim, Sejong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 20 days.

(21) Appl. No.: 17/491,905

(22) Filed: Oct. 1, 2021

(65) Prior Publication Data
US 2022/0149091 A1 May 12, 2022

(30) Foreign Application Priority Data
Nov. 6, 2020 (KR) .................. 10-2020-0147344

(51) Int. Cl.
H01L 27/146 (2006.01)
H04N 25/13 (2023.01)
H04N 25/704 (2023.01)

(52) U.S. Cl.
CPC .... *H01L 27/14605* (2013.01); *H01L 27/1463* (2013.01); *H01L 27/1464* (2013.01); *H01L 27/14621* (2013.01); *H01L 27/14627* (2013.01); *H01L 27/14634* (2013.01); *H01L 27/14636* (2013.01); *H01L 27/14645* (2013.01); *H04N 25/13* (2023.01); *H04N 25/704* (2023.01)

(58) Field of Classification Search
CPC ......... H01L 27/14605; H01L 27/14621; H01L 27/14627; H01L 27/1463; H01L 27/14634; H01L 27/14636; H01L 27/1464; H01L 27/14645; H04N 5/36961; H04N 9/04551; H04N 9/0455
See application file for complete search history.

(56) References Cited

U.S. PATENT DOCUMENTS

| | | | |
|---|---|---|---|
| 8,558,338 B2 | 10/2013 | Tsuji | |
| 9,094,624 B2 | 7/2015 | Shimotsusa et al. | |
| 9,412,775 B2 | 8/2016 | Lin et al. | |
| 9,634,049 B2 | 4/2017 | Chang et al. | |
| 9,786,710 B2 | 10/2017 | Chang et al. | |

(Continued)

*Primary Examiner* — Gevell V Selby
(74) *Attorney, Agent, or Firm* — Sughrue Mion, PLLC

(57) ABSTRACT

Provided is an image sensor including a substrate, an element separation film provided on the substrate and having a mesh shape, a plurality of pixel regions formed by the element separation film, the plurality of pixel regions including a first pixel region and a second pixel region that is adjacent to the first pixel region, the element separation film being interposed between the first pixel region and the second pixel region, a first lens provided to extend along the first pixel region and the second pixel region, a first color filter configured to transmit light focused by the first lens to the first pixel region and the second pixel region, and a color filter grid forming a region in which the first color filter is provided, and at least partially overlapping the first pixel region and the second pixel region in a vertical direction.

20 Claims, 19 Drawing Sheets

(56) References Cited

U.S. PATENT DOCUMENTS

| | | |
|---|---|---|
| 10,002,899 B2 | 6/2018 | Chou et al. |
| 10,056,426 B2 | 8/2018 | Cheng et al. |
| 10,506,187 B2 | 12/2019 | Kim et al. |
| 2016/0173857 A1* | 6/2016 | Yamazaki .............. H04N 5/369 348/47 |
| 2019/0052861 A1* | 2/2019 | Yamazaki .............. H04N 5/369 |
| 2020/0091207 A1 | 3/2020 | Cheng et al. |
| 2020/0111822 A1 | 4/2020 | Chou et al. |
| 2020/0243579 A1* | 7/2020 | Pyo ................... H01L 27/14627 |
| 2020/0273892 A1* | 8/2020 | Perkins ............. H01L 27/14629 |

* cited by examiner

APSb(SARb)

IMAGE SENSOR INCLUDING COLOR FILTER GRID INCLUDING PORTION OVERLAPPING SUPER PHASE DETECTION (PD) PIXEL

CROSS-REFERENCE TO THE RELATED APPLICATION

This application claims priority to Korean Patent Application No. 10-2020-0147344 filed on Nov. 6, 2020 in the Korean Intellectual Property Office, the entirety of which is incorporated herein by reference.

BACKGROUND

1. Field

Example embodiments of the present disclosure relate to an image sensor and an image sensing system including the image sensor.

2. Description of Related Art

Various pixel array structures for performing auto-focusing AF include a phase difference detection auto-focusing (PDAF) that detects a phase difference of light incident on a pixel array, and performs auto-focusing by including a super phase detection (PD) pixel between general pixels.

With a decrease in diameter of the pixel, a diameter of a microlens and an overall optical structure decreases, and thus, a height of an optical structure is also lowered. As a result, a height of a super PD microlens, which is formed with the same height/mask as microlens of the general pixel, is also lowered which may cause deterioration of an AF segregation ratio performance.

When using a dual pattern lens which forms the microlens of the super PD as a separate mask, the process becomes more complicated and the efficiency of the fabricating method may be lowered. Accordingly, there is a need to prevent performance deterioration of AF operation, while using the microlens which uses the same mask.

SUMMARY

One or more example embodiments provide an image sensor in which an AF operation performance is improved.

One or more example embodiments also provide an image sensor including a color filter grid including a portion which overlaps a super PD pixel in an inward direction from a planar viewpoint.

However, aspects of the present disclosure are not restricted to the example embodiments set forth herein. The above and other aspects of the present disclosure will become more apparent to one of ordinary skill in the art to which the present disclosure pertains by referencing the detailed description of the present disclosure given below.

According to an aspect of an example embodiment, there is provided an image sensor including a substrate, an element separation film provided on the substrate and having a mesh shape, a plurality of pixel regions formed by the element separation film, the plurality of pixel regions including a first pixel region and a second pixel region that is adjacent to the first pixel region, the element separation film being interposed between the first pixel region and the second pixel region, a first lens provided to extend along the first pixel region and the second pixel region, a first color filter configured to transmit light focused by the first lens to the first pixel region and the second pixel region, and a color filter grid forming a region in which the first color filter is provided, and at least partially overlapping the first pixel region and the second pixel region in a vertical direction.

According to another aspect of an example embodiment, there is provided an image sensor including a substrate including a first pixel region and a second pixel region provided adjacent to the first pixel region, an element separation film being interposed between the first pixel region and the second pixel region, a first photoelectric conversion element provided on the substrate in the first pixel region, a second photoelectric conversion element provided on the substrate in the second pixel region, a super phase detection (PD) lens provided to extend along the first pixel region and the second pixel region, a first color filter configured to transmit light focused by the super PD lens to the first pixel region and the second pixel region, and a color filter grid forming a region in which the first color filter is provided, and at least partially overlapping the first pixel region and the second pixel region in a vertical direction.

According to another aspect of an example embodiment, there is provided an image sensing system including an image sensor configured to output an image signal, and an image signal processor connected to the image sensor, the image signal processor being configured to receive and process the image signal, wherein the image sensor may include a substrate, an element separation film provided on the substrate in a mesh shape, a plurality of pixel regions formed by the element separation film, and the plurality of pixel regions including a first pixel region, a second pixel region, and a third pixel region provided adjacent to each other in a horizontal direction, a first lens provided to extend along the first pixel region and the second pixel region, a second lens provided on the third pixel region, a first color filter configured to transmit light focused by the first lens to the first pixel region and the second pixel region, a second color filter configured to transmit light focused by the second lens to the third pixel region, and a color filter grid forming a region in which the first color filter is provided, the color filter grid at least partially overlapping the first pixel region and the second pixel region in a vertical direction

BRIEF DESCRIPTION OF THE DRAWINGS

The above and/or other aspects and features of the present disclosure will become more apparent by describing example embodiments thereof referring to the attached drawings, in which.

DETAILED DESCRIPTION OF THE EMBODIMENTS

Figure 1:
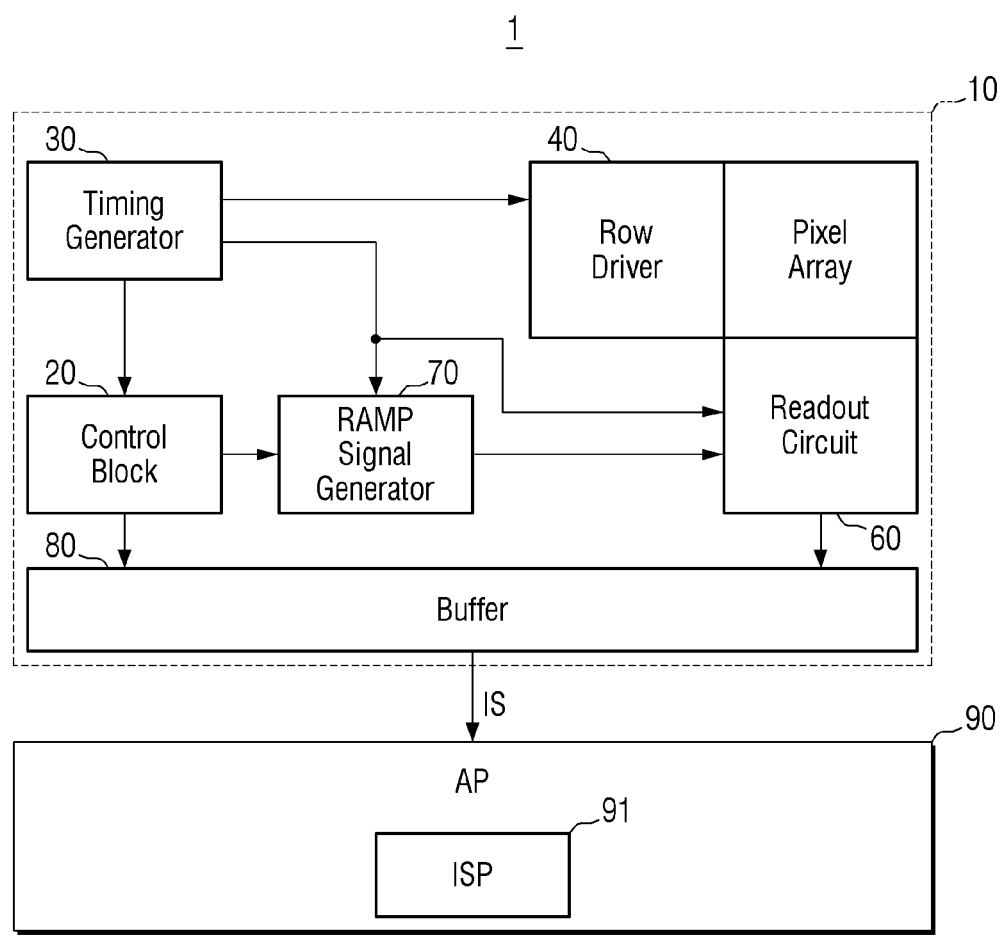
FIG. 1 is a block diagram for explaining an image sensing system according to example embodiments.

Hereinafter, example embodiments according to the technical idea of the present disclosure will be described referring to the accompanying drawings. In the explanation of FIGS. 1 to 19, the same reference numerals are used for substantially the same components, and repeated description of the components will not be provided. Also, similar reference numerals are used for similar components throughout various drawings of the present disclosure.

Referring to FIG. 1, an image sensing system 1 may include an image sensor 10 and an application processor 90. Here, although the image sensor 10 may be placed in the camera module, embodiments according to the technical idea of the present disclosure are not limited thereto.

The image sensor 10 may sense an image to be sensed by the use of the incident light to generate an image signal IS. In example embodiments, the generated image signal IS may be, for example, a digital signal. However, embodiments are not limited thereto.

The image signal IS may be provided to and processed by an application processor 90. For example, the image signal IS may be provided to an image signal processor 91 included in the application processor 90 and processed by the image signal processor 91. The image signal processor 91 may process or treat the image signal IS to be more easily displayed.

In example embodiments, the image sensor 10 and the application processor 90 may be provided separately as shown in FIG. 1. For example, the image sensor 10 may be mounted on a first chip and an application processor 90 may be mounted on a second chip to communicate with each other through an interface. However, embodiments are not limited thereto. For example, the image sensor 10 and the application processor 90 may be implemented as a single package, for example, a multi-chip package (MCP).

The image sensor 10 may include a control register block 20, a timing generator 30, a row driver 40, an active pixel sensor array 50, a readout circuit 60, a ramp signal generator 70, and a buffer 80.

The control register block 20 may generally control the operation of the image sensor 10. In particular, the control register block 20 may directly transmit an operation signal to the timing generator 30, the ramp signal generator 70, and the buffer 80.

The timing generator 30 may generate a signal that is a reference for the operation timing of a plurality of components of the image sensor 10. The operation timing reference signal generated by the timing generator 30 may be transferred to the row driver 40, the readout circuit 60, the ramp signal generator 70, and the like.

The ramp signal generator 70 may generate and transmit the ramp signal used for the readout circuit 60. For example, the readout circuit 60 may include a correlated double sampler (CDS), a comparator, and the like. The ramp signal generator 70 may generate and transmit the ramp signal used for the correlated double sampler (CDS), the comparator, and the like.

The buffer 80 may include, for example, a latch. The buffer 80 may temporarily store the image signal IS to be provided to the outside, and may transmit the image signal IS to an external memory or an external device.

The active pixel sensor array 50 may receive light and sense external images. The active pixel sensor array 50 may include a plurality of pixels or unit pixels. The row driver 40 may selectively activate the row of the active pixel sensor array 50.

The readout circuit 60 samples the pixel signal provided from the active pixel sensor array APS, compares it with the ramp signal, and may convert the analog image signal (data) into digital image signal (data) based on the result of the comparison.

Figure 2:
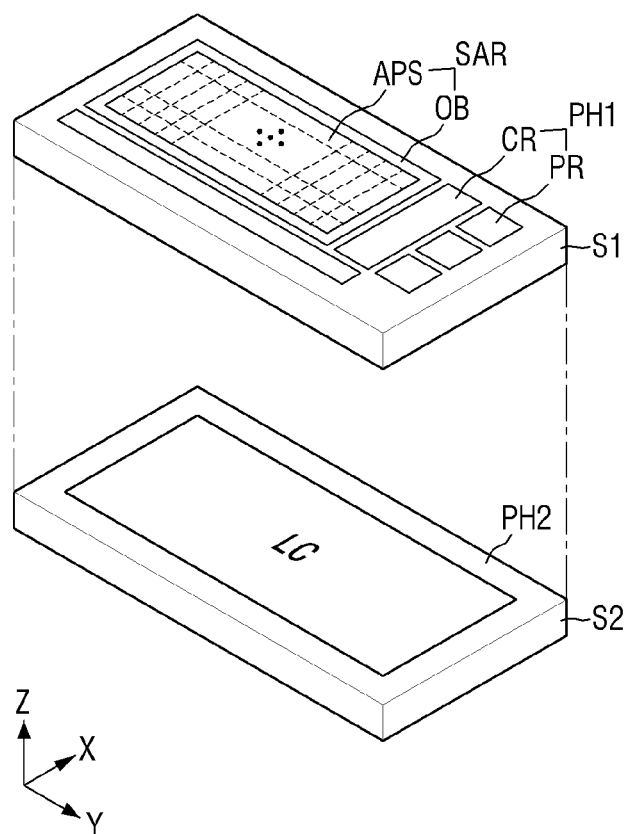
FIG. 2 is a diagram for explaining a conceptual layout of the image sensor of FIG. 1.

FIG. 2 is a diagram for explaining the conceptual layout of the image sensor of FIG. 1.

Referring to FIG. 2, the image sensor 10 may include a first region S1 and a second region S2 stacked in a first direction (e.g., a vertical direction that is a z-axis direction). The first region S1 and the second region S2 may extend in a second direction (x-axis direction) and a third direction (y-axis direction) which intersect the first direction, as shown. The timing control register block 20, the timing generator 30, the row driver 40, the active pixel sensor array 50, the readout circuit 60, and the buffer 80 shown in FIG. 1 may be placed in the first region S1 and the second region S2.

A third region in which a memory is placed may be placed in a lower part of the second region S2. The memory placed in the third region may receive the image data from the first region S1 and the second region S2, store or process the image data, and re-transmit the image data to the first region S1 and the second region S2. In this case, the memory may include a memory element such as a dynamic random access memory (DRAM) element, a static random access memory (SRAM) element, a spin transfer torque magnetic random access memory (STT MRAM) element, and a flash memory element. When the memory includes, for example, the DRAM element, the memory may receive and process the image data at a relatively high speed. Also, in example embodiments, the memory may also be placed in the second region S2.

The first region S1 may include the sensor array region SAR and a first peripheral region PH1, and the second region S2 may include a logic circuit region LC and a second peripheral region PH2. The first region S1 and the second region S2 may be sequentially stacked and placed one above the other.

In the first region S1, the sensor array region SAR may include a region corresponding to the active pixel sensor array 50 of FIG. 1. For example, a plurality of unit pixels arranged two-dimensionally (for example, in the form of a matrix) may be formed in the sensor array region SAR.

The sensor array region SAR may include a light-receiving region APS and a light-shielding region OB. Active pixel sensor arrays 50 that receive light and generate an active signal may be arranged in the light-receiving region APS. Optical black pixels that block light and generate an optical black signal may be arranged in the light-shielding region OB. For example, as illustrated in FIG. 2, the light-shielding region OB may be formed along the periphery of the light-receiving region APS, however, embodiments are not limited thereto.

In example embodiments, dummy pixels may be formed in the light-receiving region APS adjacent to the light-shielding region OB.

The first peripheral region PH1 may include a connecting region CR and a pad region PR. The connecting region CR may be formed around the sensor array region SAR. Referring to FIG. 2, the connecting region CR may be formed on one side of the sensor array region SAR, however embodiments are not limited thereto. The connecting region CR includes wirings configured to transmit and receive electrical signals of the sensor array region SAR.

The pad region PR may be formed around the sensor array region SAR. Referring to FIG. 2, the pad region PR may be formed adjacent to the edge of the image sensor, however embodiments are not limited thereto. The pad region PR is connected to an external device or the like, and may be configured to transmit and receive electrical signals between the image sensor 10 according to example embodiments and the external device.

In the second region S2, the logic circuit region LC may include electronic elements including a plurality of transistors. The electronic elements included in the logic circuit region LC may be electrically connected to the pixel array PA to provide a constant signal to each unit pixel of the active pixel sensor array APS or control the output signal.

For example, the control register block 20, the timing generator 30, the row driver 40, the readout circuit 60, the ramp signal generator 70, the buffer 80 and the like described referring to FIG. 1 may be placed in the logic circuit region LC. For example, blocks other than the active pixel sensor array APS among the blocks of FIG. 1 may be placed in the logic circuit region LC.

The second region S2 may include a second peripheral region PH2 corresponding to the first peripheral region PH1 of the first region S1. However, embodiments are not limited thereto.

Figure 3:
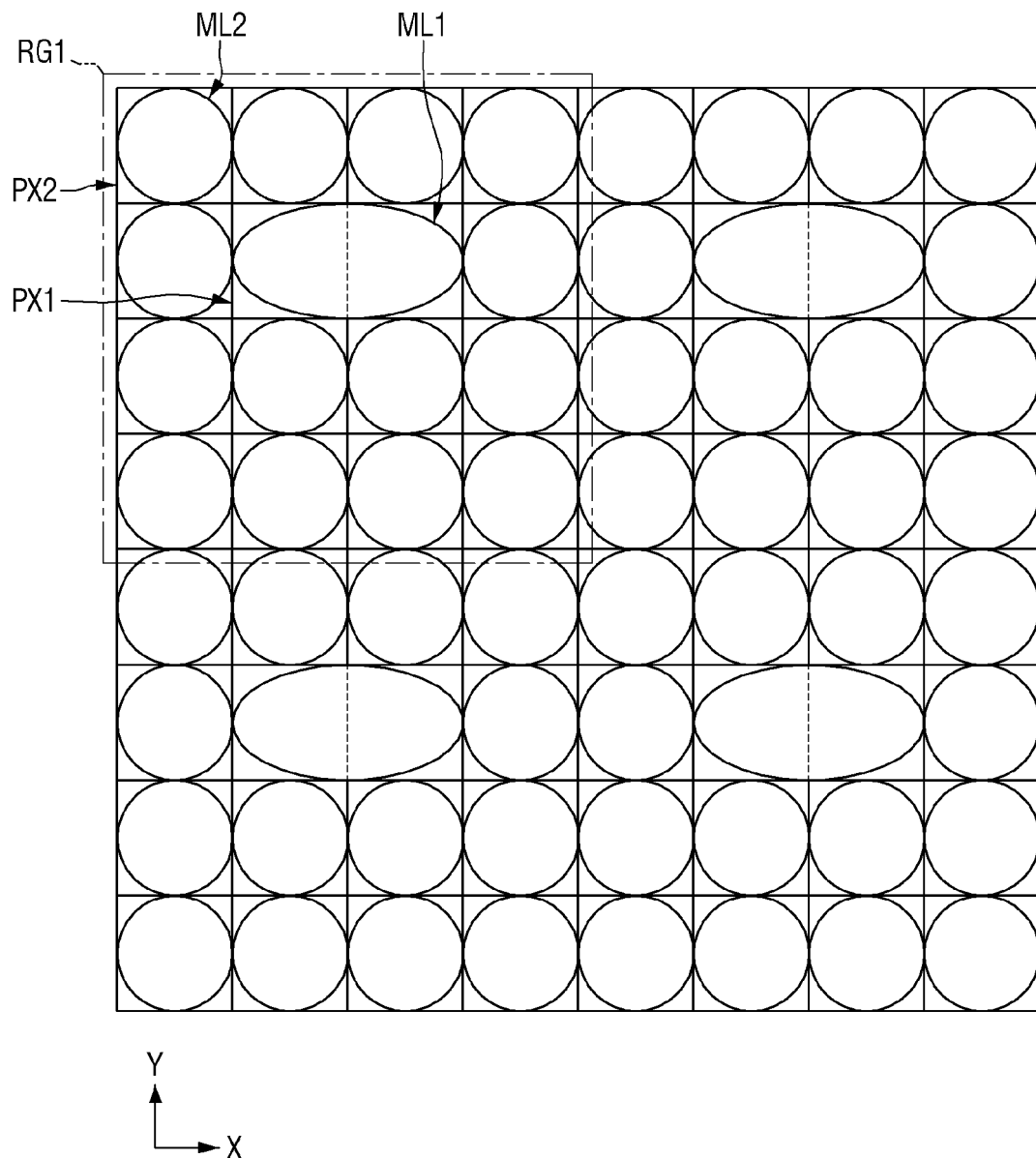
FIG. 3 is a diagram for explaining a sensor array region according to example embodiments.

FIG. 3 is a diagram for explaining a sensor array region according to example embodiments.

Referring to FIG. 3, the sensor array region SARa may include first pixels PX1 and second pixels PX2. The first pixels PX1 and the second pixels PX2 may be arranged two-dimensionally. For example, the first pixels PX1 and the second pixels PX2 may be repeatedly placed in the first direction and the second direction. The first pixels PX1 and the second pixels PX2 may be arranged at regular intervals along the first direction and the second direction. However, embodiments are not limited thereto, and the first pixels PX1 and the second pixels PX2 may be arranged in other forms.

In example embodiments, the first pixels PX1 are super PD pixels, which may two-dimensionally occupy twice an area corresponding to the area occupied by the second pixels PX2. The first pixels PX2 may be placed by being surrounded to be adjacent to the second pixels PX2.

The first pixel PX1 may include a first microlens ML1 and the second pixel PX2 may include a second microlens ML2. Each of the microlenses ML1 and ML2 may be placed above each unit pixel region (221, see FIG. 6). For example, when viewed from above, the microlenses ML1 and ML2 may be placed on an upper surface of the sensor array region SAR.

In example embodiments, the first microlens ML1 may be a super PD lens and may have an elliptical shape from a two-dimensional viewpoint, and the second pixel PX2 may have a circular shape from a two-dimensional viewpoint. In example embodiments, a length of a major axis of the first microlens ML1 may be twice a length of a diameter of the second microlens ML2.

Figure 4:
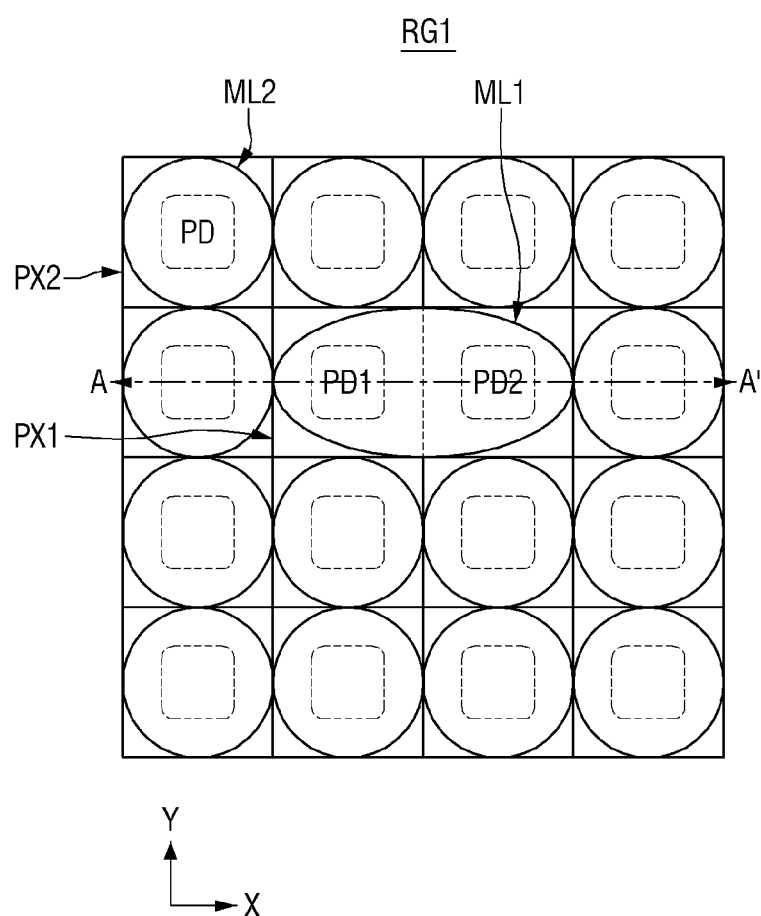
FIG. 4 is a diagram for explaining the sensor array region of a region RG1 of FIG. 3.

FIG. 4 is a diagram for explaining the RG1 region of the sensory array region SARa in FIG. 3. Referring to FIG. 4, each of the first pixels PX1 and second pixels PX2 may include photoelectric conversion elements PD, PD1, and PD2. For example, the first pixel PX1 may be a super PD pixel and may include a first photoelectric conversion element PD1 and a second photoelectric conversion element PD2, and may perform an AF operation, using a phase difference of the light that is incident on the first and second photoelectric conversion elements PD1 and PD2. The second pixel PX2 may be a normal pixel, and may include a photoelectric conversion element PD.

Figure 5:
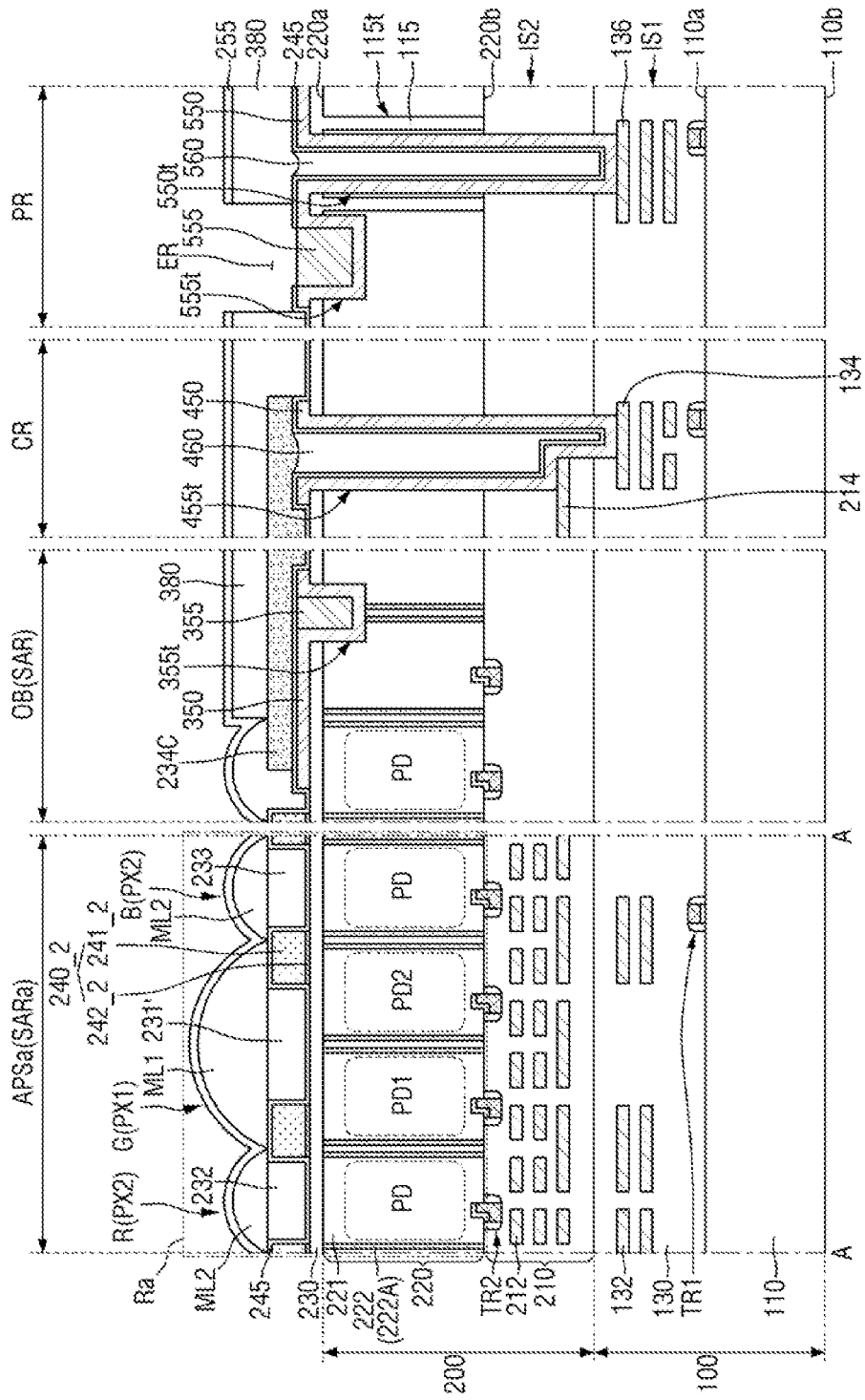
FIG. 5 is a cross-sectional view taken along a line A-A' of FIG. 4, for explaining a light-shielding region, a connecting region and a pad region of FIG. 2.
Figure 6:
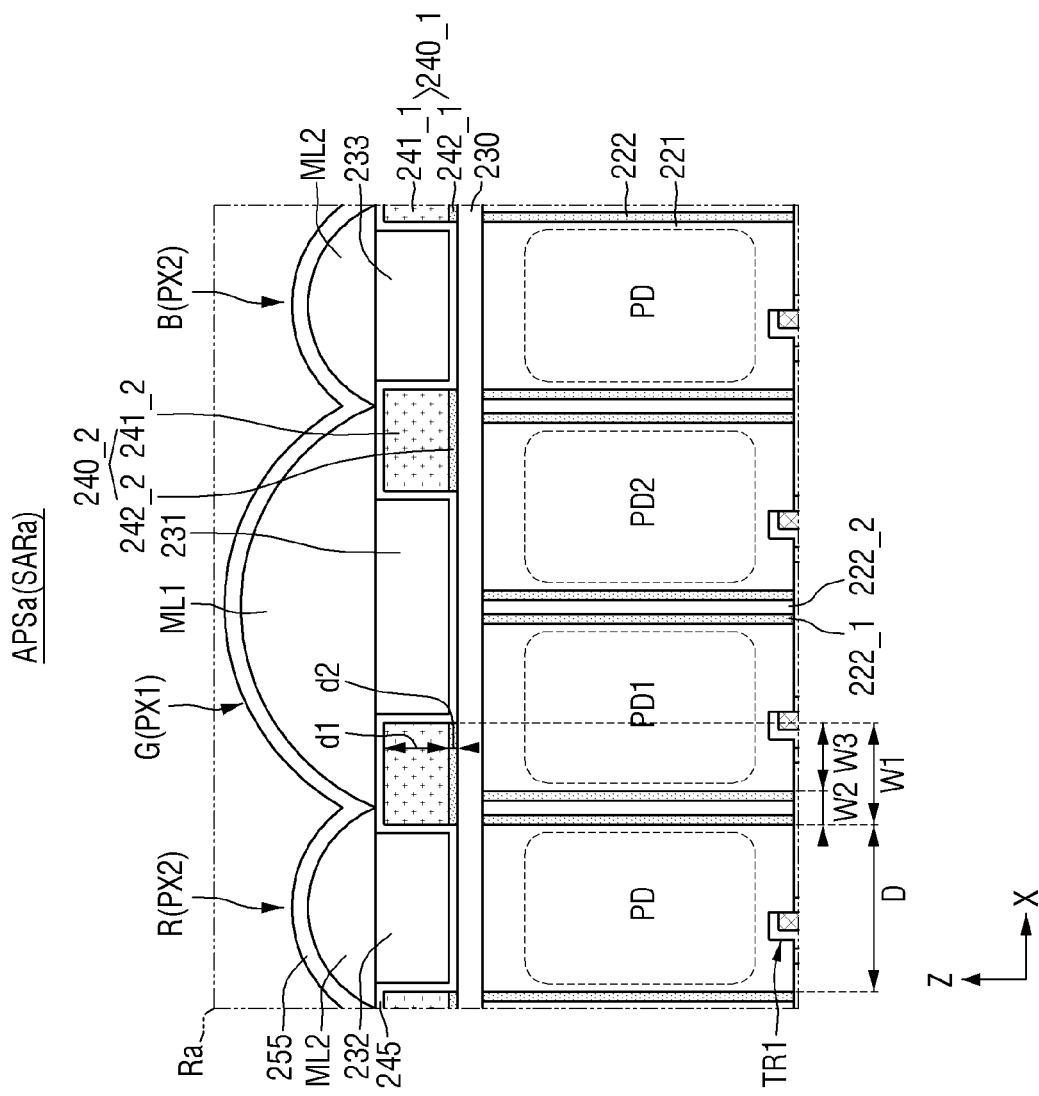
FIG. 6 is an enlarged view of a region Ra of FIG. 5.
Figure 7:
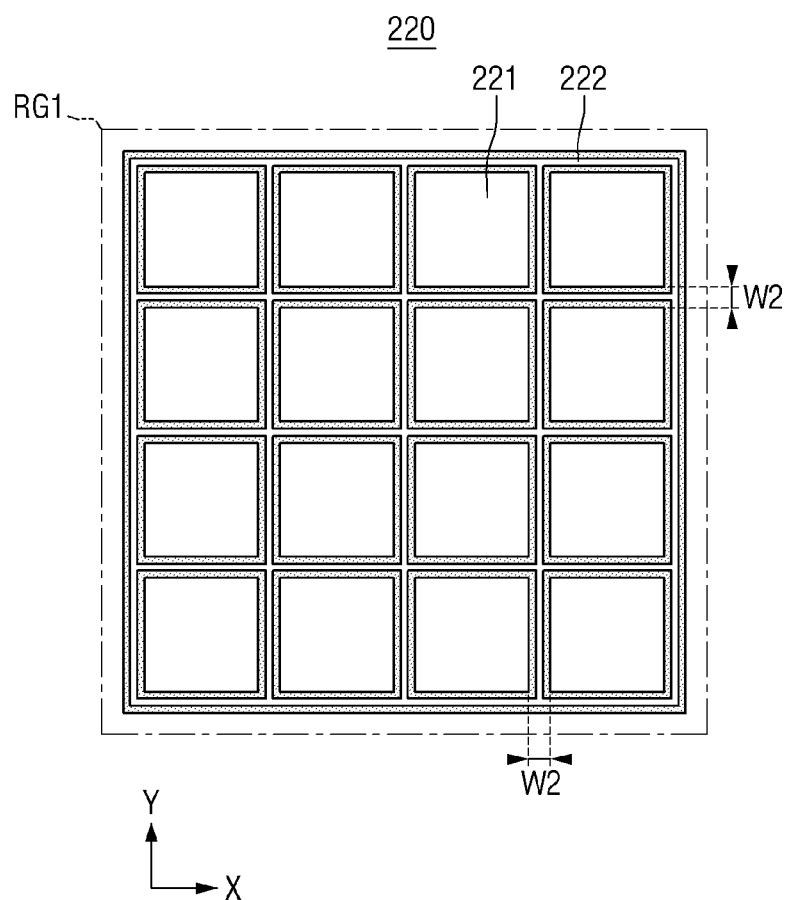
FIG. 7 is a diagram for explaining an element separation film of the sensor array region according to example embodiments.

The sensor array region SARa may include a plurality of unit pixel regions (221, see FIGS. 5 and 7) defined by a mesh-like element separation film (222, see FIGS. 5 and 7). According to an example embodiment, the two-dimensionally occupied area of the unit pixel region (221, see FIGS. 5 and 7) defined by the element separation film (222, see FIGS. 5 and 7) may be the same as each other, and each pixel region (221, see FIGS. 6 and 8) may each include one of the photoelectric conversion elements PD, PD1, and PD2. However, embodiments are not limited thereto, and a plurality of photoelectric conversion elements may be included in a single pixel region.

Figure 8:
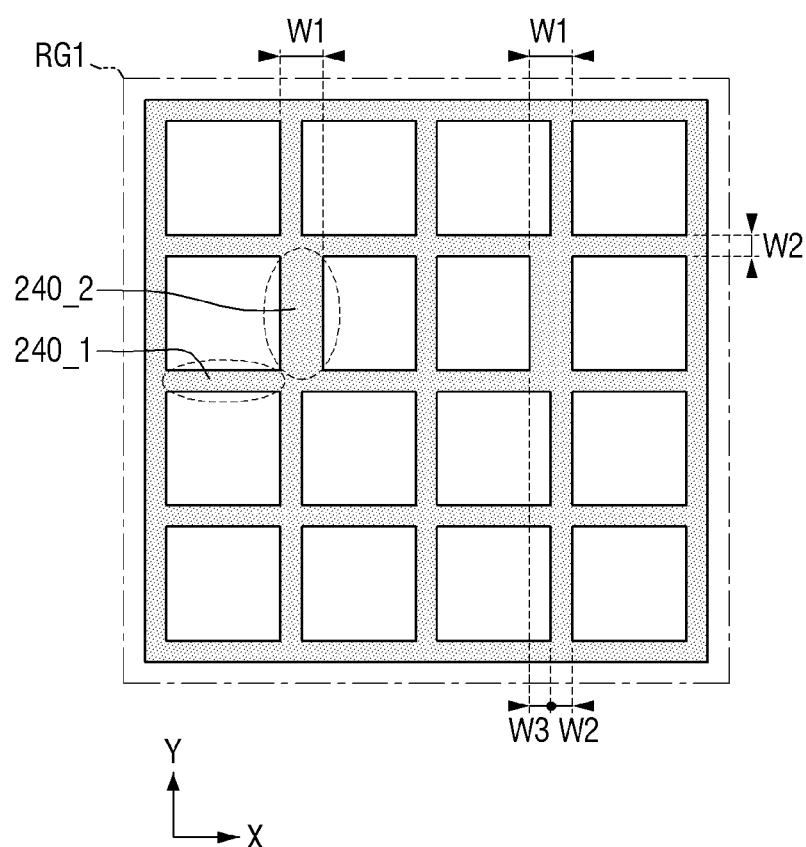
FIG. 8 is a diagram for explaining a color filter grid of the sensor array region according to example embodiments.

FIG. 5 is a cross-sectional view taken along a line A-A' of FIG. 4, for explaining a light-shielding region, a connecting region and a pad region of FIG. 2. FIG. 6 is an enlarged view of a region Ra of FIG. 5. FIG. 7 is a diagram for explaining an element separation film of the sensor array region according to example embodiments. FIG. 8 is a diagram for explaining a color filter grid of the sensor array region according to example embodiments.

Referring to FIGS. 4 to 8, the image sensor according to example embodiments includes a first substrate 110, a first wiring structure IS1, a second substrate 220, a second wiring structure IS2, a second substrate 220, a second wiring structure IS2, a surface insulating film 230, color filters 231, 232, and 233, a color filter grid 240a, and microlenses ML1 and ML2.

The first substrate 110 may be bulk silicon or silicon-on-insulator (SOI). The first substrate 110 may be a silicon substrate or may include other materials, for example, silicon germanium, indium antimonide, lead tellurium compounds, indium arsenic, indium phosphide, gallium arsenide or gallium antimonide. Alternatively, the first substrate 110 may have an epitaxial layer formed on a base substrate.

The first substrate 110 may include a first surface 110a and a second surface 110b which are opposite to each other. In example embodiments, the first surface 110a of the first substrate 110 may be a surface that faces a fourth surface 220b of the second substrate 220.

A plurality of electronic elements may be formed on the first substrate 110. For example, a second electronic element TR2 may be formed on the first surface 110a of the first substrate 110. The first electronic element TR1 may be electrically connected to the sensor array region SARa to transmit and receive electrical signals to and from each unit pixel of the sensor array region SARa. For example, the first electronic element TR1 may include electronic elements constituting the control register block 20, the timing generator 30, the row driver 40, the active pixel sensor array 50, the readout circuit 60, the ramp signal generator 70, and the buffer 80 of FIG. 1.

The first wiring structure IS1 may be formed on the first substrate 110. For example, the first wiring structure IS1 may cover the first surface 110a of the first substrate 110. The first substrate 110 and the first wiring structure IS1 may form the first substrate structure 100.

The first wiring structure IS1 may be attached to the second wiring structure IS2. For example, as shown in FIG. 5, an upper surface of the first wiring structure IS1 may be attached to a bottom surface of the second wiring structure IS2.

The first wiring structure IS1 may include one or more wirings. For example, the first wiring structure IS1 may include a first inter-wiring insulating film 130, and a plurality of wirings 132, 134, and 136 in the first inter-wiring insulating film 130. In FIG. 5, the number of layers of wirings constituting the first wiring structure IS1 and the arrangement thereof are merely examples, and are not limited thereto. The first inter-wiring insulating film 130 may include, but is not limited to, for example, at least one of silicon oxide, silicon nitride, silicon oxynitride and a low dielectric constant (low-k) material having a lower dielectric constant than silicon oxide. In example embodiments, the first wiring structure IS1 may also include the same material as the second wiring structure IS2.

At least a part of the wirings 132, 134, and 136 of the first wiring structure IS1 may be connected to the first electronic element TR1. In example embodiments, the first wiring structure IS1 may include a first wiring 132 in the sensor array region SARa, a second wiring 134 in the connecting region CR, and a third wiring 136 in the pad region PR. In some embodiments, the second wiring 134 may be an uppermost wiring of the plurality of wirings in the connecting region CR, and the third wiring 136 may be an uppermost wiring of the plurality of wirings in the pad region PR.

The first wiring 132, the second wiring 134, and the third wiring 136 may include, but is not limited to, for example, at least one of tungsten (W), copper (Cu), aluminum (Al), gold (Au), silver (Ag) and alloys thereof.

The second substrate 220 may be a semiconductor substrate. For example, the second substrate 220 may be bulk silicon or SOL The second substrate 220 may be a silicon substrate or may include other materials, for example, silicon germanium, indium antimonide, lead tellurium compounds, indium arsenic, indium phosphide, gallium arsenide or gallium antimonide. Alternatively, the second substrate 220 may have an epitaxial layer formed on the base substrate.

The second substrate 220 may include a third surface 220a and a fourth surface 220b that are opposite to each other. In example embodiments to be described below, the third surface 220a may be referred to as a back side of the second substrate 220, and the fourth surface 220b may be referred to as a front side of the second substrate 220. In example embodiments, the third surface 220a of the second substrate 220 may be a light-receiving surface on which light is incident. For example, the image sensor according to example embodiments may be a backside illumination (BSI) image sensor.

A plurality of unit pixel regions 221 may be formed on the second substrate 220 of the sensor array region SARa. The first pixel PX1 and the second pixel PX2 may be formed on each of the plurality of unit pixel regions 221 through the placement of the first microlens ML1 and the second microlens ML2 and the placement of the color filters 231, 232, and 233.

For example, as shown in FIG. 3, a plurality of pixels PX1 and PX2 which are arranged two-dimensionally (for example, in the form of a matrix) in a plane including the first direction (X-axis direction) and the second direction (Y-axis direction) may be formed the light-receiving region APS.

The element separation film 222A may be formed inside the second substrate 220 of the sensor array region SARa in a mesh-like grid pattern. The element separation film 222A may be formed, for example, by burying an insulating material in a deep trench formed by patterning the second substrate 220. In example embodiments, the element separation film 222A may penetrate the second substrate 220. For example, as shown in FIG. 5, the element separation film 222A may extend from the third surface 220a to the second surface 220b.

The element separation film 222A may define a plurality of unit pixel regions 221. The element separation film 222A is formed in a mesh-like grid pattern from a planar viewpoint, and may separate the plurality of pixels PX1 and PX2 from each other. According to the example embodiment, referring to FIG. 6, a diameter D of each unit pixel region 221 may be in the range of 0.5 um to 0.9 um, and the element separation film 222A has a thickness as large as a second width W2.

For example, as shown in FIG. 7, the unit pixel regions 221 arranged along the light-receiving region APSa may be separated from each other. As a result, the element separation film 222A may be formed to surround each unit pixel region 221 from a planar viewpoint. The element separation film 222A is placed between the first photoelectric conversion element PD1 and the second photoelectric conversion element PD2 inside the second pixel PX2 including the unit pixel regions 221 adjacent to each other, and may separate the first photoelectric conversion element PD1 and the second photoelectric conversion element PD2.

In example embodiments, the element separation film 222A may include an insulating spacer film 222A_1 and a filling conductive film 222A_2. The insulating spacer film 222A_1 may extend along the side faces of the trench formed inside the second substrate 220. The filling conductive film 222A_2 may be formed on the insulating spacer film 222A_1 to fill the remaining region of the trench.

In example embodiments, the insulating spacer film 222A_1 may include an oxide film having a lower refractive index than the second substrate 220. For example, the insulating spacer film 222A_1 may include, but is not limited to, at least one of silicon oxide, aluminum oxide, tantalum oxide, and a combination thereof. The insulating spacer film 222A_1, which has a lower refractive index than the second substrate 220, may refract or reflect light which is obliquely incident on the photoelectric conversion element PD. Also, the insulating spacer film 222A_1 may prevent the light charges generated in a specific unit pixel due to the incident light from moving to the adjacent unit pixel by a random drift. The insulating spacer film 222A_1 may improve the light-receiving rate of the photoelectric conversion element PD.

In example embodiments, the filling conductive film 124 may include a conductive material. For example, the filling conductive film 222A_2 may include, but is not limited to, polysilicon (poly Si). In example embodiments, a ground voltage or a negative voltage may be applied to the filling conductive film 222A_2 including the conductive material.

Therefore, it is possible to effectively prevent an electrostatic discharge (ESD) bruise defect of the image sensor according to some embodiments. Here, the ESD bruise defect is a phenomenon in which the electric charges generated by ESD or the like are accumulated on the surface of the substrate (for example, the first surface 110a) to cause a bruise-like stain on the generated image.

Each unit pixel may include photoelectric conversion elements PD, PD1, and PD2. The photoelectric conversion elements PD, PD1, and PD2 may be formed in the second substrate 220 of the light-receiving region APSa. The photoelectric conversion element PD, PD1, and PD2 may generate the electric charge in proportion to an amount of light incident from the outside. In example embodiments, the photoelectric conversion element PD may not be formed in a part of the light-shielding region OB. For example, the photoelectric conversion elements PD, PD1, and PD2 may be formed in the second substrate 220 of the light-shielding region OB adjacent to the light-receiving region APSa, but may not be formed in the second substrate 220 of the light-shielding region OB spaced apart from the light-receiving region APSa.

The photoelectric conversion elements PD, PD1, and PD2 may include, but is not limited to, for example, at least one of a photo diode, a photo transistor, a photo gate, a pinned photo diode, and an organic photo diode, a quantum dot, and a combination thereof.

Each unit pixel may include a second electronic element TR2. In example embodiments, the second electronic element TR2 may be formed on the fourth surface 220b of the second substrate 220. The second electronic element TR2 may be connected to the photoelectric conversion elements PD, PD1, and PD2 to form various transistors for processing the electric signal. For example, the second electronic element TR2 may constitute transistors such as a transfer transistor TX, a reset transistor RX, a source follower transistor SF or a selection transistor SEL to be described below in the description of FIG. 9.

In example embodiments, the second electronic element TR2 may include a vertical transfer transistor. For example, a part of the second electronic element TR2 constituting the transfer transistor TX described above may extend into the second substrate 220. Such a transfer transistor TX may reduce an area of the unit pixel to enable a high integration of the image sensor.

The second wiring structure IS2 may be formed on the second substrate 220. For example, the second wiring structure IS2 may cover the fourth surface 220b of the second substrate 220. The second substrate 220 and the second wiring structure IS2 may form the second substrate structure 200.

The second wiring structure IS2 may be made up of one or more wirings. For example, the second wiring structure IS2 may include a second inter-wiring insulating film 210, and a plurality of wirings 212 and 214 in the second inter-wiring insulating film 210. In FIG. 5, the number of wiring layers constituting the second wiring structure IS2 and the arrangement thereof are merely examples. The second inter-wiring insulating film 210 may include, but is not limited to, for example, at least one of silicon oxide, silicon nitride, silicon oxynitride and a low dielectric constant (low-k) material having a lower dielectric constant than silicon oxide.

In example embodiments, the second wiring structure IS2 may include a fourth wiring 212 in the sensor array region SARa, and a fifth wiring 214 in the connecting region CR. The fourth wiring 212 may be electrically connected to the unit pixel of the sensor array region SARa. For example, the fourth wiring 212 may be connected to the second electronic element TR2. The fifth wiring 214 may extend from the sensor array region SARa. For example, the fifth wiring 214 may be electrically connected to at least a part of the fourth wiring 212. Therefore, the fifth wiring 214 may be electrically connected to the unit pixel of the sensor array region SARa.

The fourth wiring 212 and the fifth wiring 214 may include, but is not limited to, for example, at least one of tungsten (W), copper (Cu), aluminum (Al), gold (Au), silver (Ag), and alloys thereof.

The surface insulating film 230 may be formed on the third surface 220a of the second substrate 220. The surface insulating film 230 may extend along the third surface 220a of the second substrate 220. In example embodiments, at least a part of the surface insulating film 230 may be in contact with the element separation film 222A.

The surface insulating film 230 may include an insulating material. For example, the surface insulating film 230 may include, but is not limited to, at least one of silicon oxide, silicon nitride, silicon oxynitride, aluminum oxide, hafnium oxide, and a combination thereof. In the drawings, although the surface insulating film 230 is shown as a single film, embodiments not limited thereto, and the surface insulating film 230 may be formed of multi-films.

The surface insulating film 230 may function as an antireflection film to prevent reflection of light incident on the second substrate 220, thereby improving the light-receiving rate of the photoelectric conversion elements PD, PD1, and PD2. Also, the surface insulating film 140 may function as a flattening film to form color filters 231, 232, and 234 and microlenses ML1 and ML2 at uniform heights.

The color filters 231, 232, and 233 may be formed on the surface insulating film 230 of the light-receiving region APSa. In example embodiments, the color filters 231, 232, and 233 may be arranged to correspond to the pixels PX1 and PX2.

For example, a plurality of color filters 231, 232 and 233 may be arranged two-dimensionally in a plane including the first direction (X-axis direction) and the second direction (Y-axis direction).

The first color filter 231 is placed in the first pixel PX1 and may be placed over a plurality of unit pixel regions 221 included in the first pixel PX1. For example, the first color filter 231 may overlap the first photoelectric conversion element PD1 and the second photoelectric conversion element PD2 in a third direction (z-axis direction) perpendicular to the second substrate 220.

The second and third color filters 232 and 233 are placed in the second pixel PX2 and may be placed on the unit pixel region 221 included in the second pixel PX2. For example, the first color filter 231 may overlap the first photoelectric conversion element PD1 and the second photoelectric conversion element PD2 in the third direction (z-axis direction) perpendicular to the second substrate 220.

The color filters 231, 232, and 233 may have various color filters depending on the pixels. For example, the color filters 231, 232, and 233 may be placed in a Bayer pattern that includes a red color filter, a green color filter, and a blue color filter.

In example embodiments, the first color filter 231 may be a green color filter, the second color filter 232 may be a red color filter, and the third color filter 233 may be a blue color. However, embodiments are not limited to the aforementioned arrangement of the filter.

According to example embodiments, the color filters 231, 232, and 233 may include a yellow filter, a magenta filter and a cyan filter, and may also further include a white filter.

Referring to FIGS. 6 and 8, the color filter grid 240a may be placed between the respective color filters 231, 232, and 233, and may define a region in which the color filters 231, 232, and 233 are placed. For example, each of the color filters 231, 232, and 233 may be placed in the space between the color filter grids 240a.

Referring to FIG. 6, the color filter grid 240a may include a low refractive index material layers 241_1 and 241_2 and lower metal layers 242_1 and 242_2. The low refractive index material layers 241_1 and 241_2 may include a low refractive index material having a lower refractive index than silicon (Si). For example, the low refractive index material layers 241_1 and 241_2 may include at least one of silicon oxide, aluminum oxide, tantalum oxide, SICOH and combinations thereof. According to example embodiments, the low refractive index material layers 241_1 and 241_2 may have a porous layer structure including voids in the aforementioned materials. Light loss may be eliminated, while having a lower refractive index than the color filters 231, 232, and 233 through the porous layer structure, and the lower the refractive index is, the higher an AF segregation ratio rise through the beam focus effect to be obtained may be. The low refractive index material layers 241_1 and 241_2 including the low refractive index material may improve the quality of the image sensor, by refracting or reflecting the light which is obliquely incident on the image sensor.

The low refractive index material layers 241_1 and 241_2 have a first thickness d1, and may be 200 nm to 500 nm. For example, if the diameter D1 of the unit pixel region 221 is 0.64 um, when the first thickness d1 is in the range of 350 nm to 390 nm, the AF segregation ratio of the image sensor 10 may be optimized. If the lower metal layers 242_1 and 242_2 are included below the low refractive index material layers 241_1 and 241_2, when the first thickness d1 is in the range of 200 nm to 300 nm, the AF segregation ratio of the image sensor 10 may be optimized.

Although the lower metal layers 242_1 and 242_2 may include tungsten (W), aluminum (Al), Ti, TiN, Ta, TaN and the like, embodiments are not limited thereto. When the second thickness d2 of the lower metal layers 242_1 and 242_2 is in the range of 3 nm to 100 nm, the AF segregation ratio of the image sensor 10 may be optimized.

The color filter grid 240a may include a first portion 240_1 and a second portion 240_1. The color filter grid 240a may separate the second color filter 232 and the third color filter 233 placed on the second pixel PX2 through the first portion 240_1. The first portion 240_1 may have a second width W2 that is the same as the thickness of the element separation film 222A, and may overlap and be aligned with the element separation film 222A from a planar viewpoint. Therefore, the first portion 240_1 may be placed not to overlap each unit pixel region 221.

The first color filter 231 placed on the first pixel PX1 and the second color filter 232 and the third color filter 233 placed on the second pixel PX2 may be separated through the second portion 240_2 of the color filter grid 240a. The second portion 240_2 may have a first width W1, and may be greater by a third width W3 than the first width W1. The second portion 240_2 may overlap the element separation film 222A by the second width W2, and may protrude toward the first pixel PX1 by the third width W3.

The second portion 240_2 may overlap the unit pixel region 221 in the second pixel PX2 by the third width W3 on both sides of the second pixel PX2 from a planar viewpoint, and may overlap the unit pixel region 221 perpendicularly to the second substrate 220 in the third direction (z-axis direction).

In example embodiments, a first protective film 245 may be formed on the surface insulating film 230 and the color filter grid 240a. The first protective film 245 may be interposed between the surface insulating film 230 and the color filters 231, 232, and 233, and between the color filter grid 240a and the color filters 231, 232, and 233. For example, the first protective film 245 may extend along the profile of the upper surface of the surface insulating film 230 and the side surfaces and upper surface of the color filter grid 240a.

The first protective film 245 may include, but is not limited to, for example, aluminum oxide. The first protective film 245 may prevent damage to the surface insulating film 230 and the color filter grid 240a.

Microlenses ML1 and ML2 may be formed on the color filters 231, 232, and 233. The microlenses ML1 and ML2 may be arranged to correspond to the respective pixels PX1 and PX2. For example, the microlenses ML1 and ML2 may be arranged two-dimensionally in a plane including the first direction (X-axis direction) and the second direction (Y-axis direction). The first microlens ML1 may be placed on the first pixel PX1, and the second microlens ML2 may be placed on the second pixel PX2.

The first microlens ML1 may be placed in the first pixel PX1 over a plurality of unit pixel regions 221, and the second microlens ML2 may be placed in the second pixel PX2 over a plurality of unit pixel regions 221.

The first microlens ML1 may be a super PD lens. Thus, the length of the major axis of the first microlens ML1 may be twice a length of a diameter of the second microlens ML2, which may be a lens of a normal pixel, and a height of the peak of the first microlens ML1 may be higher than the height of the peak of the second microlens ML2 with respect to the second substrate 220.

The microlenses ML1 and ML2 may have a convex shape and may have a predetermined radius of curvature. As a result, the microlenses ML1 and ML2 may focus the light incident on the photoelectric conversion element PD. The microlenses ML1 and ML2 may include, but are not limited to, for example, light-transmitting resins.

In example embodiments, a second protective film 255 may be formed on the microlenses ML1 and ML2. The second protective film 255 may extend along the surfaces of the microlens ML1 and ML2. The second protective film 255 may include, for example, an inorganic oxide film. For example, the second protective film 255 may include, but is not limited to, at least one of silicon oxide, titanium oxide, zirconium oxide, hafnium oxide, and a combination thereof. In example embodiments, the second protective film 255 may include a low temperature oxide (LTO).

The second protective film 255 may protect the microlenses ML1 and ML2 from the outside. For example, the second protective film 255 may protect the microlenses ML1 and ML2 including an organic material, by including the inorganic oxide film. Also, the second protective film 255 may improve the light concentration capability of the microlenses ML1 and ML2. For example, the second protective film 255 may reduce reflection, refraction, scattering or the like of incident light that reaches a space between the microlenses ML1 and ML2, by filling the space between the microlenses ML1 and ML2.

Referring to FIG. 5, the image sensor according to example embodiments may further include a first connecting structure 350, a second connecting structure 450, and a third connecting structure 550.

The first connecting structure 350 may be formed in the light-shielding region OB. The first connecting structure 350 may be formed on the surface insulating film 140 of the light-shielding region OB. The first connecting structure 350 may be in contact with the element separation film 222A. For example, a first trench 355t which exposes the element separation film 222A may be formed inside the second substrate 220 and the surface insulating film 230 of the light-shielding region OB. The first connecting structure 350 is formed in the first trench 355t and may be in contact with the element separation film 222A inside the light-shielding region OB. In example embodiments, the first connecting structure 350 may extend along the profile of the side faces and the lower surface of the first trench 355t.

In example embodiments, the first connecting structure 350 may be electrically connected to the element separation film 222A to apply a ground voltage or a negative voltage to the pixel separation pattern 120. As a result, the electric charges generated by ESD or the like may be discharged to the first connecting structure 350 through the element separation film 222A, and ESD bruise defects may be more effectively prevented.

The first connecting structure 350 may include a titanium (Ti) film, a titanium nitride (TiN) film, and a tungsten (W) film which are sequentially stacked in the first trench 355t.

In example embodiments, a first pad 355 that fills the first trench 355t may be formed on the first connecting structure 350. The first pad 355 may include, but is not limited to, for example, at least one of tungsten (W), copper (Cu), aluminum (Al), gold (Au), silver (Ag), and alloys thereof.

In example embodiments, the first protective film 245 may cover the first connecting structure 350 and the first pad 355. For example, the first protective film 245 may extend along the profile of the first connecting structure 350 and the first pad 355.

The second connecting structure 450 may be formed inside the connecting region CR. The second connecting structure 450 may be formed on the surface insulating film 230 of the connecting region CR. The second connecting structure 450 may electrically connect the first substrate structure 100 and the second substrate structure 200. For example, a second trench 455t that exposes the second wiring 134 and the fifth wiring 214 may be formed inside the first substrate structure 100 and the second substrate structure 200 of the connecting region CR. The second connecting structure 450 may be formed in the second trench 455t and connect the second wiring 134 and the fifth wiring 214. In example embodiments, the second connecting structure 450 may extend along the profile of the side faces and the lower surface of the second trench 455t.

In example embodiments, the second connecting structure 450 may include a titanium (Ti) film, a titanium nitride (TiN) film, and a tungsten (W) film that are sequentially stacked in the second trench 455t.

In example embodiments, the first protective film 245 may cover the second connecting structure 450. For example, the first protective film 245 may extend along the profile of the second connecting structure 450.

In example embodiments, a first filling insulation film 460 which fills the second trench 455t may be formed on the second connecting structure 450. The first filling insulation film 460 may include, but is not limited to, for example, at least one of silicon oxide, aluminum oxide, tantalum oxide, and a combination thereof.

A third connecting structure 550 may be formed inside the pad region PR. The third connecting structure 550 may be formed on the surface insulating film 140 of the pad region PR. The third connecting structure 550 may electrically connect the first substrate structure 100 to an external device or the like.

For example, a third trench 550t that exposes the third wiring 136 may be formed inside the first substrate structure 100 and the second substrate structure 200 of the pad region PR. The third connecting structure 550 is formed inside the third trench 550t and may be in contact with the third wiring 136.

Further, a fourth trench 555t may be formed inside the second substrate 220 of the pad region PR. The third connecting structure 550 may be formed inside the fourth trench 555t and exposed. In example embodiments, the third connecting structure 550 may extend along the profiles of the side faces and the lower faces of the third trench 550t and the fourth trench 555t.

In example embodiments, a second filling insulation film 560 that fills the third trench 550t may be formed on the third connecting structure 550. The second filling insulation film 560 may include, but is not limited to, for example, at least one of silicon oxide, aluminum oxide, tantalum oxide, and a combination thereof.

In example embodiments, a second pad 555 that fills the fourth trench 555t may be formed on the third connecting structure 550. The second pad 555 may include, but is not limited to, for example, at least one of tungsten (W), copper (Cu), aluminum (Al), gold (Au), silver (Ag), and alloys thereof.

In example embodiments, the third connecting structure 550 may include a titanium (Ti) film, a titanium nitride (TiN) film, and a tungsten (W) film that are sequentially stacked inside the third trench 550t.

In example embodiments, the first protective film 245 may cover the third connecting structure 550. For example, the first protective film 245 may extend along the profile of the third connecting structure 550. In example embodiments, the first protective film 245 may expose the second pad 555.

In example embodiments, the element separation pattern 115 may be formed inside the second substrate 220. For example, a fifth trench 115t may be formed inside the second substrate 220. The element separation pattern 115 may be formed inside the fifth trench 115t.

In FIG. 5, the element separation pattern 115 is shown as being formed only around the third connecting structure 550 of the pad region PR, however, embodiments are not limited thereto. For example, the element separation pattern 115 may be formed around the first connecting structure 350 of the light-shielding region OB or around the second connecting structure 450 of the connecting region CR.

The element separation pattern 115 may include, but is not limited to, for example, at least one of silicon oxide, silicon nitride, silicon oxynitride, aluminum oxide, hafnium oxide, and combinations thereof. In example embodiments, the element separation pattern 115 may be formed at the same level as the surface insulating film 230.

In example embodiments, a fourth color filter 234C may be formed on the first connecting structure 350 and the second connecting structure 450. For example, the fourth color filter 234C may be formed to cover a part of the first protective film 245 in the light-shielding region OB and the connecting region CR.

The fourth color filter 234C may include, but is not limited to, for example, a blue color filter.

In example embodiments, a third protective film 380 may be formed on the fourth color filter 234C. For example, the third protective film 380 may be formed to cover a part of the first protective film 245 in the light-shielding region OB, the connecting region CR and the pad region PR. In example embodiments, the second protective film 255 may extend along the surface of the third protective film 380. The third protective film 380 may include, but is not limited to, for example, light-transmitting resin. In example embodiments, the third protective film 380 may include the same material as the microlens 180.

In example embodiments, the second protective film 255 and the third protective film 380 may expose the second pad 555. For example, an exposure opening ER that exposes the second pad 555 may be formed inside the second protective film 255 and the third protective film 380. As a result, the second pad 555 is connected to an external device or the like, and may be configured to transmit and receive the electrical signal between the image sensor according to example embodiments and the external device.

Figure 9:
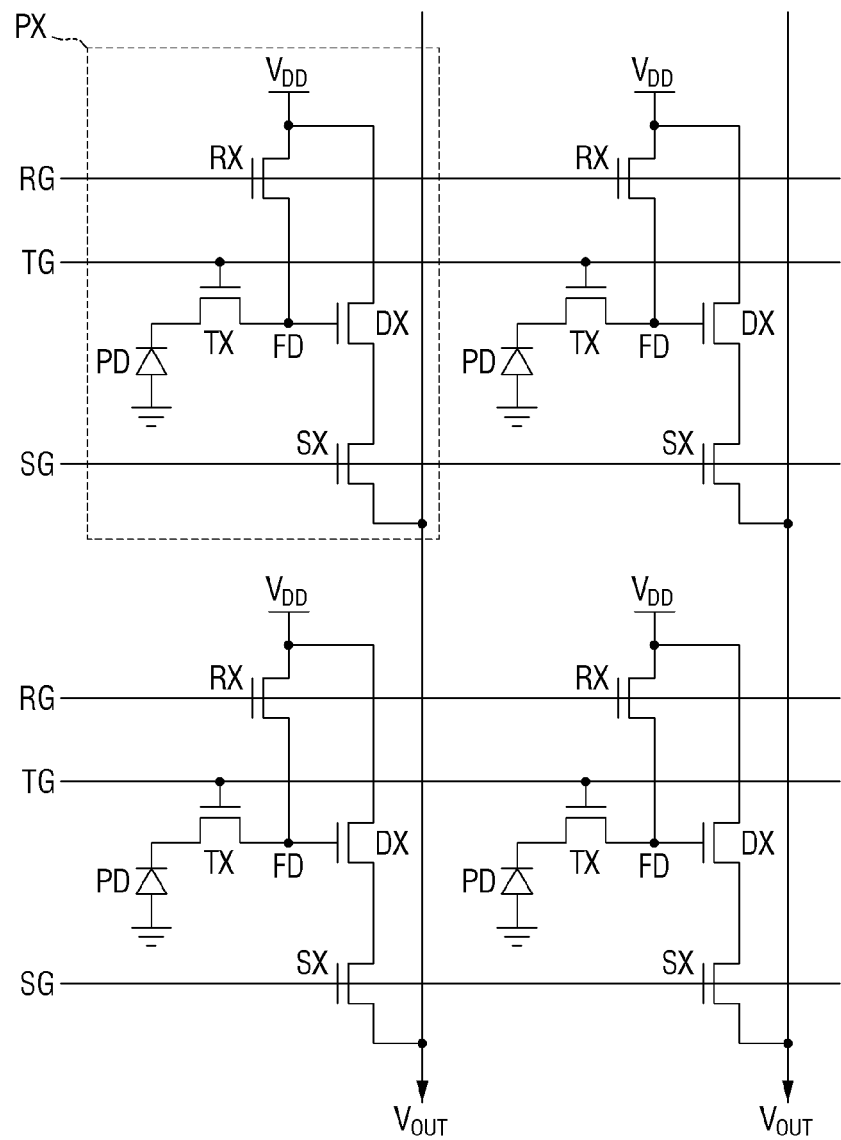
FIG. 9 is an example circuit diagram for explaining a unit pixel of an image sensor according to example embodiments.

FIG. 9 is an exemplary circuit diagram for explaining a unit pixel of the image sensor 10 according to example embodiments.

Referring to FIG. 9, a plurality of pixels PX may be arranged in the form of a matrix. Each of the plurality of pixels PX may include a transfer transistor TX and logic transistors RX, SX and DX. Here, the logic transistors may include a reset transistor RX, a selection transistor SX, and a drive transistor DX (or a source follower transistor). The reset transistor RX may include a reset gate RG, the selection transistor SX may include a selection gate SG, and the transfer transistor TX may include a transfer gate TG.

Each of the plurality of pixels PX may further include a photoelectric conversion element PD and a floating diffusion region FD. The photoelectric conversion element PD may correspond to the photoelectric conversion elements PD, PD1, and PD2 described in FIG. 5. The photoelectric conversion element PD may generate and accumulate light charges in proportion to the amount of light that is incident from the outside. The photoelectric conversion element PD may include a photo diode, a photo transistor, a photo gate, a pinned photo diode (PPD) or combinations thereof.

The transfer gate TG may transmit the electric charge generated by the photoelectric conversion element PD to the floating diffusion region FD. The floating diffusion region FD may receive and cumulatively store the electric charge generated by the photoelectric conversion element PD. The drive transistor DX may be controlled according to the amount of light charges accumulated in the floating diffusion region FD.

The reset transistor RX may periodically reset the electric charges accumulated in the floating diffusion region FD. A drain electrode of the reset transistor RX is connected to the floating diffusion region FD, and a source electrode is connected to a power supply voltage VDD. When the reset transistor RX is turned on, the power supply voltage VDD connected to the source electrode of the reset transistor RX is transmitted to the floating diffusion region FD. When the reset transistor RX is turned on, the electric charges accumulated in the floating diffusion region FD are discharged, and the floating diffusion region FD may be reset.

The drive transistor DX is connected to a current source located outside the plurality of pixels PX, functions as a source follower buffer amplifier, amplifies the potential charge in the floating diffusion region FD, and outputs the amplified charge to an output line VOUT.

The selection transistor SX may select the plurality of pixels PX on a row basis, and when the selection transistor SX is turned on, the power supply voltage VDD may be transmitted to the source electrode of the drive transistor DX.

Figure 10:
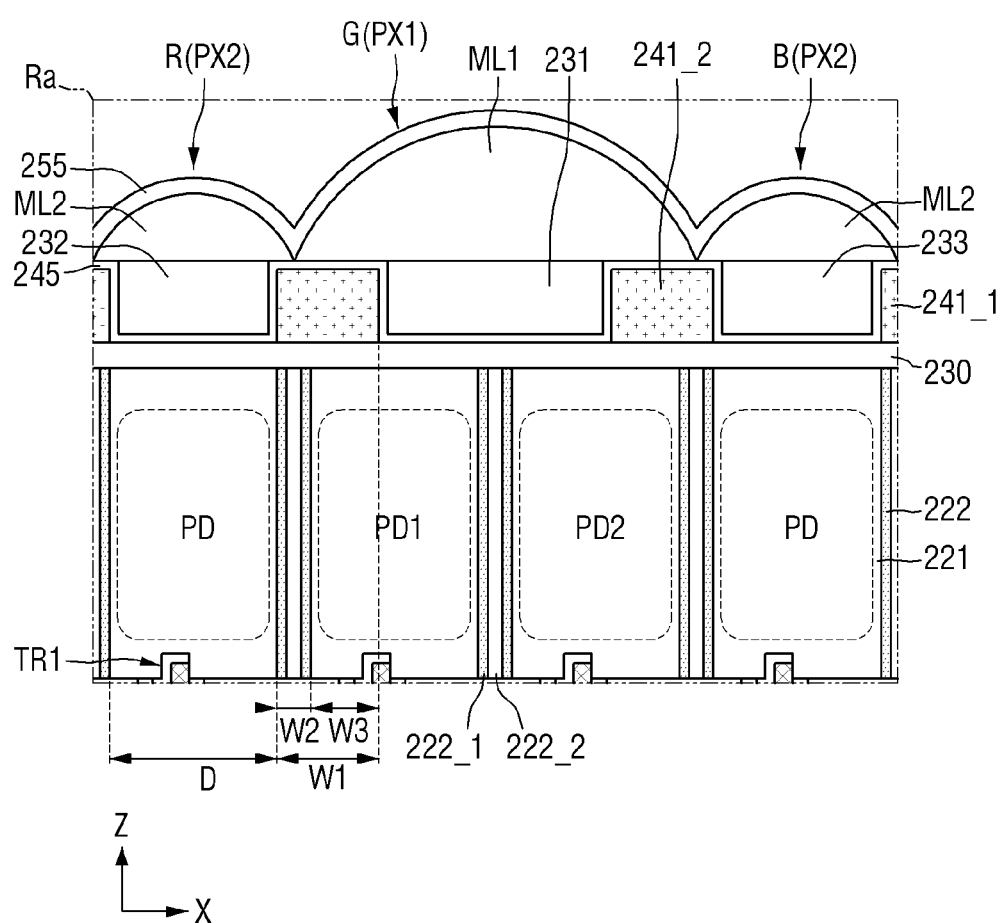
FIG. 10 is a diagram for explaining an image sensor according to other example embodiments.

FIG. 10 is a diagram for explaining an image sensor according to another example embodiment.

Hereinafter, a sensor array region SARb in the image sensor according to another example embodiment will be described referring to FIG. 10. Differences from the sensor array region SARa in the image sensor shown in FIG. 6 will be mainly described.

When compared to the color filter grid 240a of FIG. 6, the sensor array region SARb includes a color filter grid including low refractive index materials 241_1 and 241_2 of a single layer. Therefore, the low refractive index material layers 241_1 and 241_2 may be placed on the surface insulating film 230.

In a case where the diameter D1 of the unit pixel region 221 is 0.64 um, when the thickness of the row refractive index material layers 241_1 and 241_2 is in the range of 350 nm to 390 nm, the AF segregation ratio performance of the image sensor 10 may be optimized.

Figure 11:
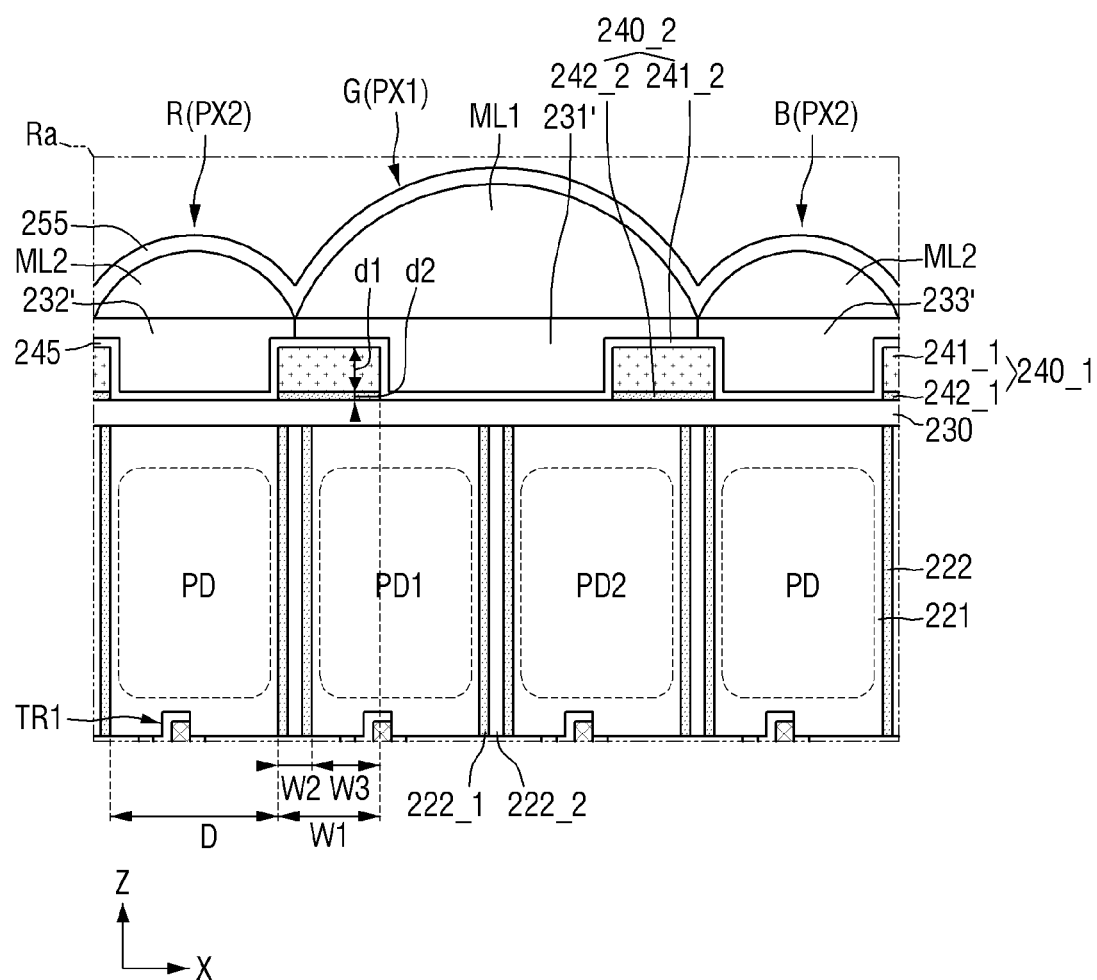
FIG. 11 is a diagram for explaining an image sensor according to other example embodiments.

FIG. 11 is a diagram for explaining an image sensor according to another example embodiment.

Hereinafter, the sensor array region SARc in the image sensor according to another example embodiment will be described referring to FIG. 11. Differences from the sensor array region SARa in the image sensor shown in FIG. 6 will be mainly described.

When compared with the placement of the color filters 231, 232, and 233 of FIG. 6, a part of the color filter 231', 232', and 233' may be placed on the top of the color filter grid 240a. Therefore, a part of the color filters 231', 232', and 233' may be provided at a level that is higher than an uppermost surface of the first protective film 245.

The color filters 231', 232', and 233' according to example embodiments may be placed between the color filter grid 240a and the microlenses ML1 and ML2, and from a planar viewpoint, an interface between the color filters 231', 232', and 233' may be aligned with an interface of the microlenses ML1 and ML2.

Figure 12:
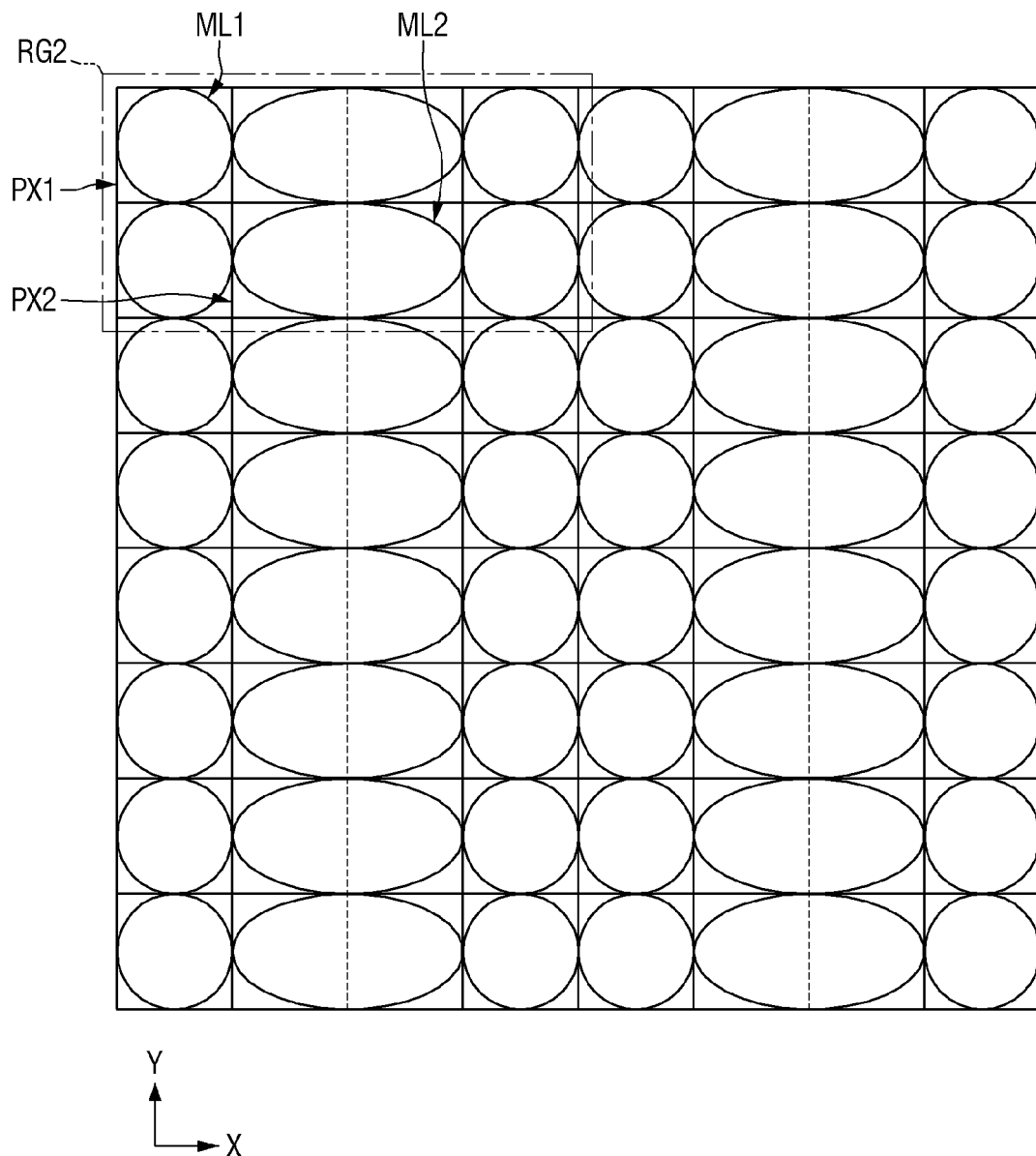
FIGS. 12, 13, and 14 are diagrams for explaining an image sensor according to another example embodiment.
Figure 13:
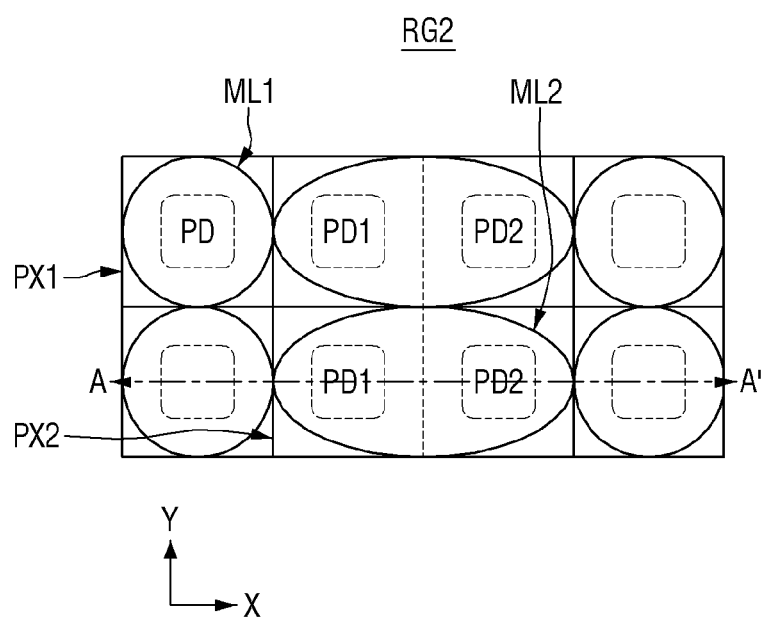
Figure 14:
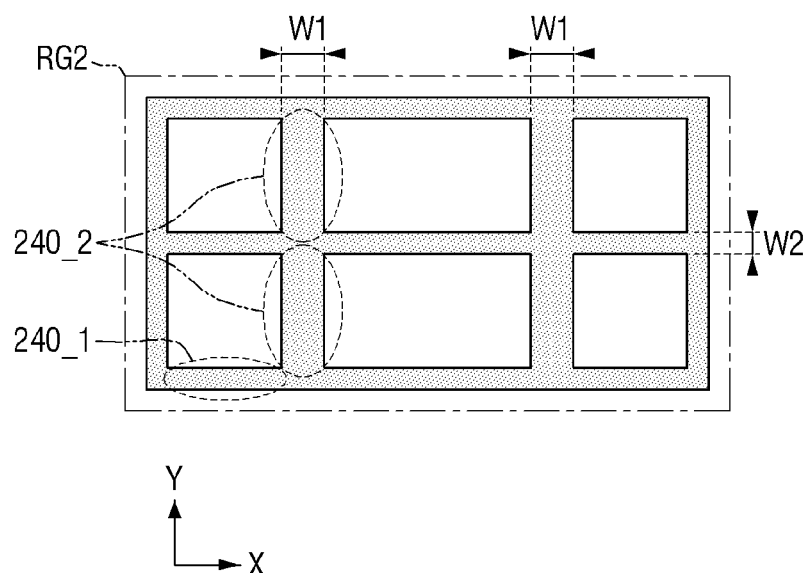

FIGS. 12 to 14 are diagrams for explaining an image sensor according to another example embodiment.

Hereinafter, the sensor array region SARd in the image sensor according to other example embodiments will be described referring to FIGS. 12 to 14. Differences from the sensor array region SARa in the image sensor shown in FIGS. 3 to 4 will be mainly described.

When compared with the arrangement of the first and second pixels PX1 and PX2 of FIG. 3, the first pixel PX1 which may be a super PD pixel may be placed in a row in the second direction Y. The second pixels PX2 which may be normal pixels may be placed between the pixel rows in which the first pixels PX1 are placed.

Figure 15:
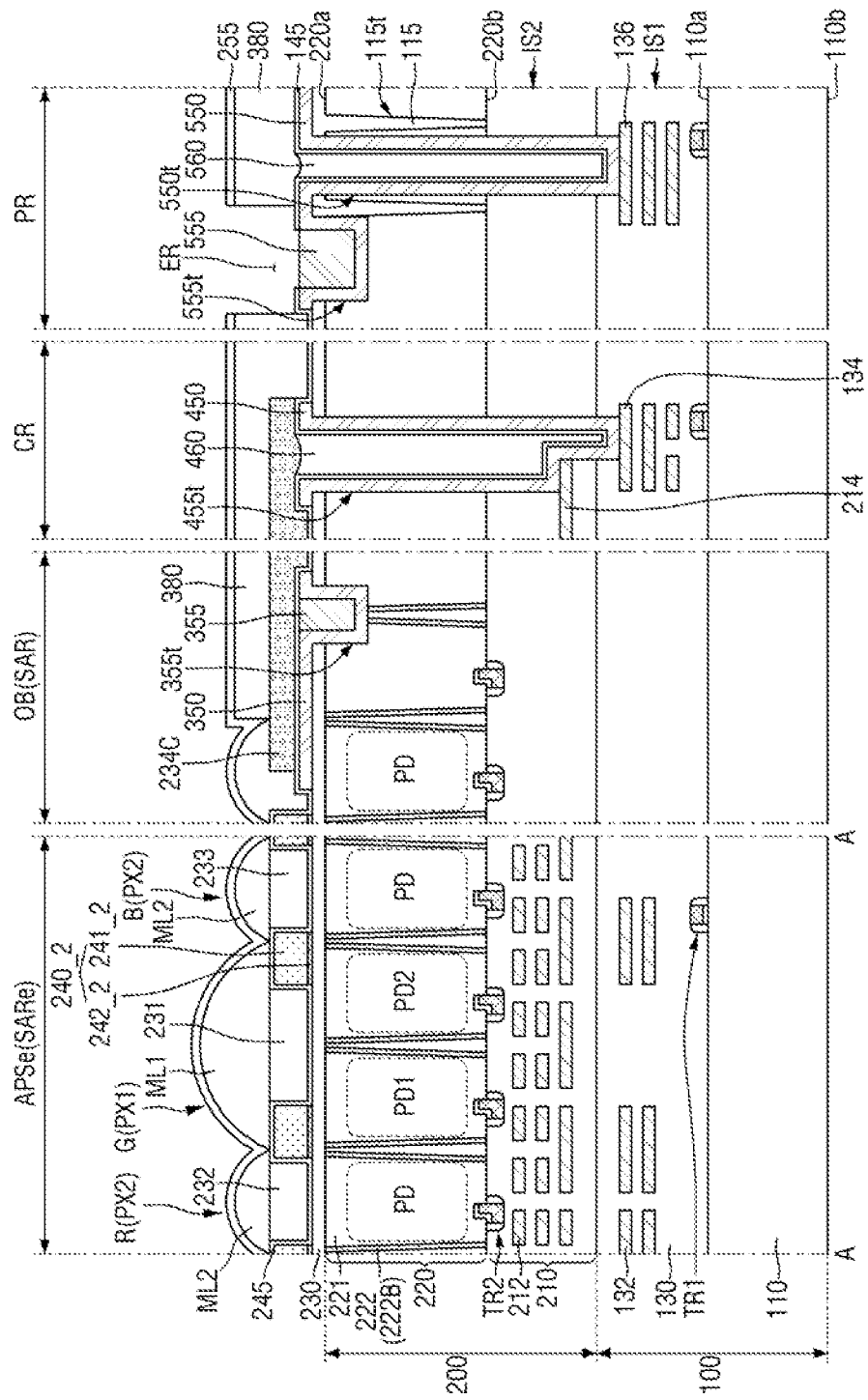
FIG. 15 is a diagram for explaining an image sensor according to another example embodiment.

FIG. 15 is a diagram for explaining an image sensor according to another example embodiments.

Hereinafter, an image sensor according to another example embodiments will be described referring to FIG. 15. Differences from the image sensor shown in FIG. 5 will be mainly described.

When compared with the element separation film 222A of FIG. 5, a width of an element separation film 222B decreases from the fourth surface 220b of the second substrate 220 toward the third surface 220a of the second substrate 220.

This may be due to the characteristics of the etching process for forming the element separation film 222B. For example, the process of etching the second substrate 220 for forming the element separation film 222B may be performed on the fourth surface 220b of the second substrate 220.

In example embodiments, the width of the element separation pattern 115 may decrease from the third surface 220a of the second substrate 220 toward the fourth surface 220b of the second substrate 220.

This may be due to the characteristics of the etching process for forming the element separation pattern 115. For example, the process of etching the second substrate 220 for forming the element separation pattern 115 may be performed on the third surface 220a of the second substrate 220.

Figure 16:
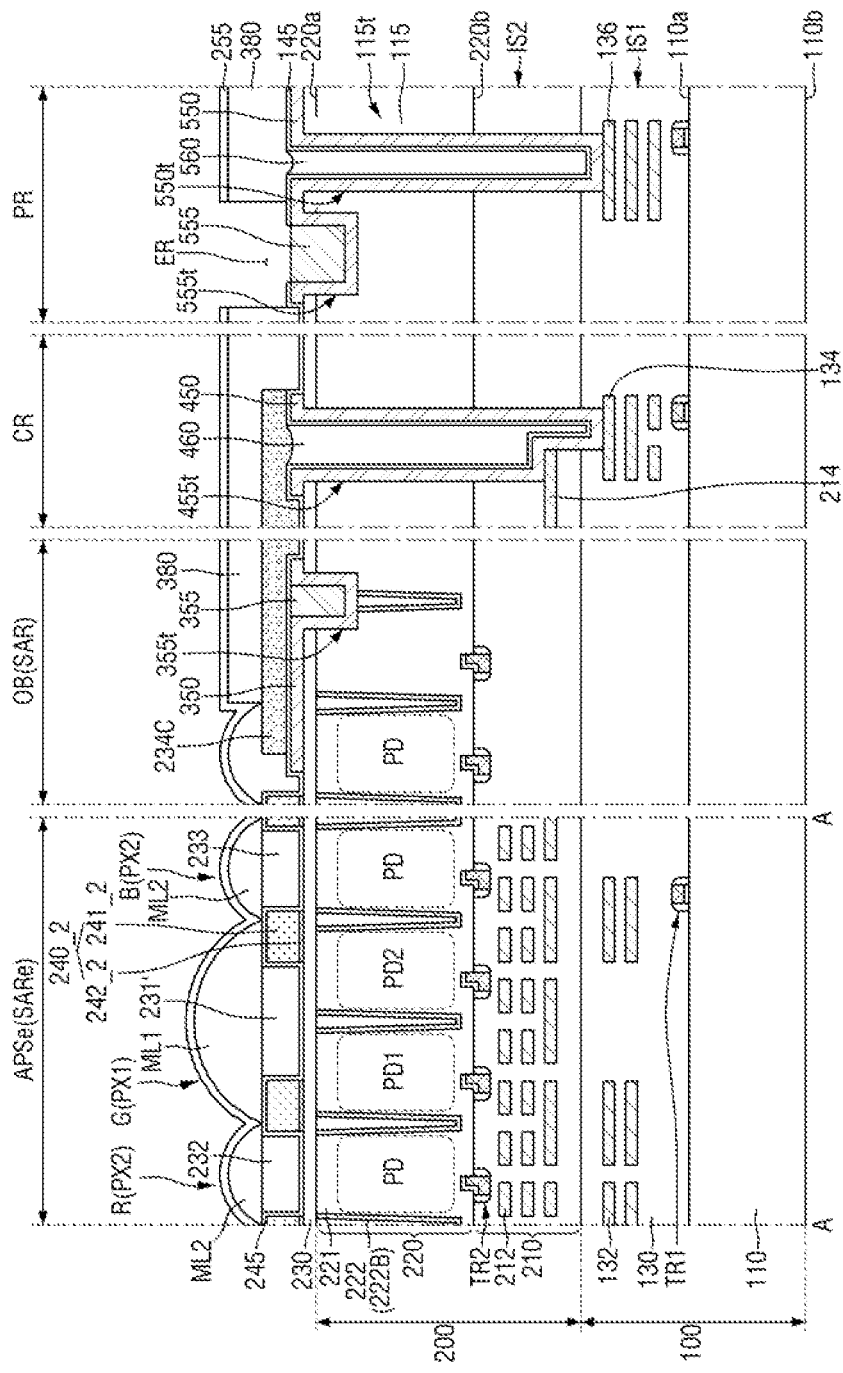
FIG. 16 is a diagram for explaining an image sensor according to another example embodiment.

FIG. 16 is a diagram for explaining an image sensor according to another example embodiment.

Hereinafter, an image sensor according to another example embodiment will be described referring to FIG. 16. Differences from the image sensor shown in FIG. 15 will be mainly described.

When compared with the element separation film 222A of FIG. 5, a width of an element separation film 222C decreases from the third surface 220a of the second substrate 220 toward the fourth surface 220b of the second substrate 220.

This may be due to the characteristics of the etching process for forming the element separation film 222C. For example, the process of etching the second substrate 220 to form the element separation film 222C may be performed on the third surface 220a of the second substrate 220.

In example embodiments, the element separation film 222C may not completely penetrate the second substrate 220. For example, the element separation film 222C may extend from the third surface 220a of the second substrate 220, but may not extend to the fourth surface 220b of the second substrate 220. For example, the lowermost surface of the element separation film 222C may be spaced apart from the fourth surface 220b of the second substrate 220.

Figure 17:
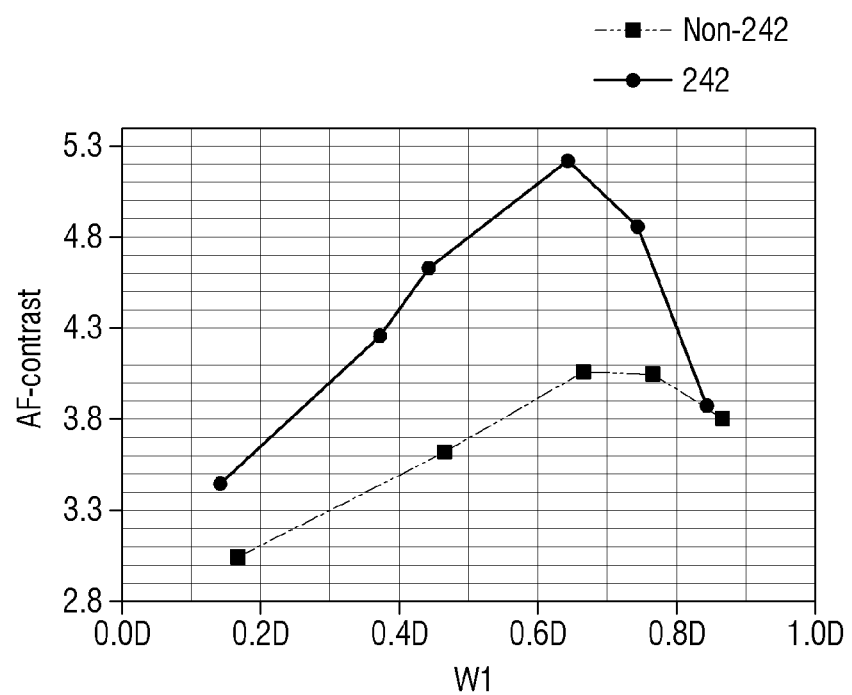
FIG. 17 is a graph for explaining the effect of the image sensor according to example embodiments.

FIG. 17 is a graph for explaining the effect of the image sensor according to example embodiments. FIG. 17 is a graph showing the AF segregation ratio of the image sensor 10 with a change in the first width W1 of the color filter grid 240a.

According to example embodiments, the first width W1 of the color filter grid 240a extends, while protruding in an inward direction of the first pixel PX1, and as the first width W1 of the color filter grid 240a increases, a region in which the unit pixel region 221 and the color filter grid 240a in the first pixel PX1 overlap each other from a planar viewpoint increases.

Referring to FIG. 17, when the color filter grid 240a does not include the lower metal layer 242, and when the first width W1 of the second portion 240_2 included in the color filter grid 240a is 0.2 times the diameter D of the unit pixel region 221, the AF segregation ratio is 3.1. When the first width W1 of the color filter grid 240a is 0.4 times the diameter D of the unit pixel region 221, the AF segregation ratio is 3.5. When the first width W1 of the color filter grid 240a is 0.6 times the diameter D of the unit pixel region 221, the AF segregation ratio is 3.9. When the color filter grid 240a does not include the lower metal layer 242, the AF segregation ratio rises to 4.05.

When the color filter grid 240a includes the lower metal layer 242, when the first width W1 of the color filter grid 240a is 0.2 times the diameter D of the unit pixel region 221, the AF segregation ratio is 3.65. When the first width W1 of the color filter grid 240a is 0.4 times the diameter D of the unit pixel region 221, the AF segregation ratio is 4.4. When the first width W1 of the color filter grid 240a is 0.6 times the diameter D of the unit pixel region 221, the AF segregation ratio is 5.1. When the color filter grid 240a does not include the lower metal layer 242, the AF segregation ratio rises to 5.2. Since the lower metal layer 242 of the color filter grid 240a may absorb example of the light focused on the unit pixel region 221, when the color filter grid 240a includes the lower metal layer 242, even if the first width W1 of the color filter grid 240a is relatively narrow, the peak of AF segregation ratio may be reached.

When the first width W1 of the color filter grid 240a including the lower metal layer 242 becomes larger than the first width W1 that reaches the peak of AF segregation ratio, a decrease width of the AF segregation ratio may be greater than the color filter grid 240a that does not include the lower metal layer 242.

As the image sensor is highly integrated, the size of the unit pixel gradually decreases, and the diameter and depth of super PD lenses such as the first pixel PX1 also decrease accordingly. As a result, it may be difficult to bring the focal height of the super PD lens included in the first pixel PX1 to match the focal height of the normal lens in the second pixel PX2, and the performance degradation of AF segregation ratio may occur.

The focal height of the super PD lens may be adjusted, while making the color filter grid 240a including the low refractive index material layer 241 overlap the unit pixel region 221 in the first pixel PX1, and the amount of light focused on the unit pixel region 221 through the lower metal layer 242 may also be adjusted.

In example embodiments, the first width W1 of the second portion 240_2 included in the color filter grid 240a may be adjusted to improve the performance of AF segregation ratio.

Figure 18:
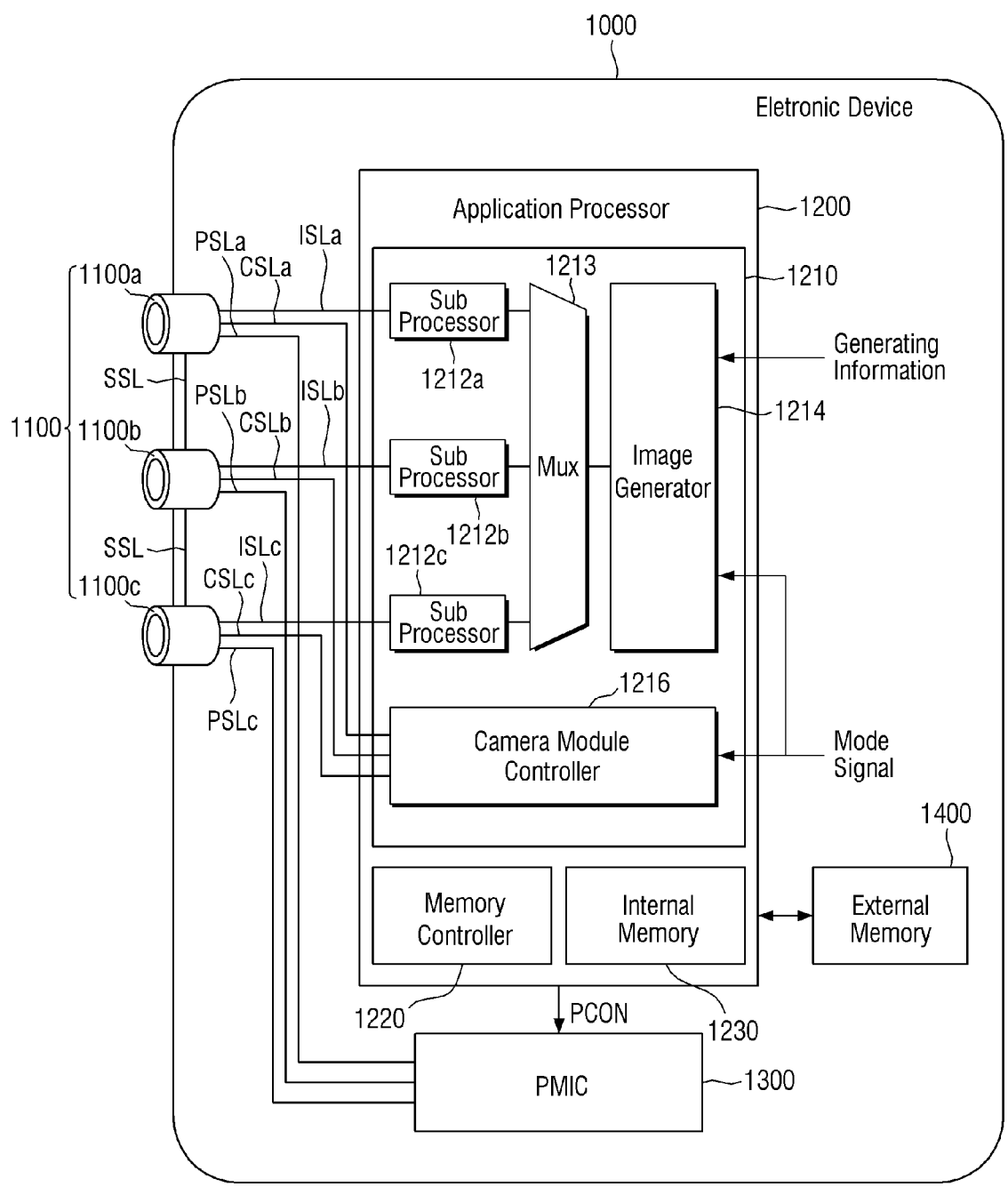
FIG. 18 is a block diagram for explaining an electronic device including a multi-camera module according to example embodiments.
Figure 19:
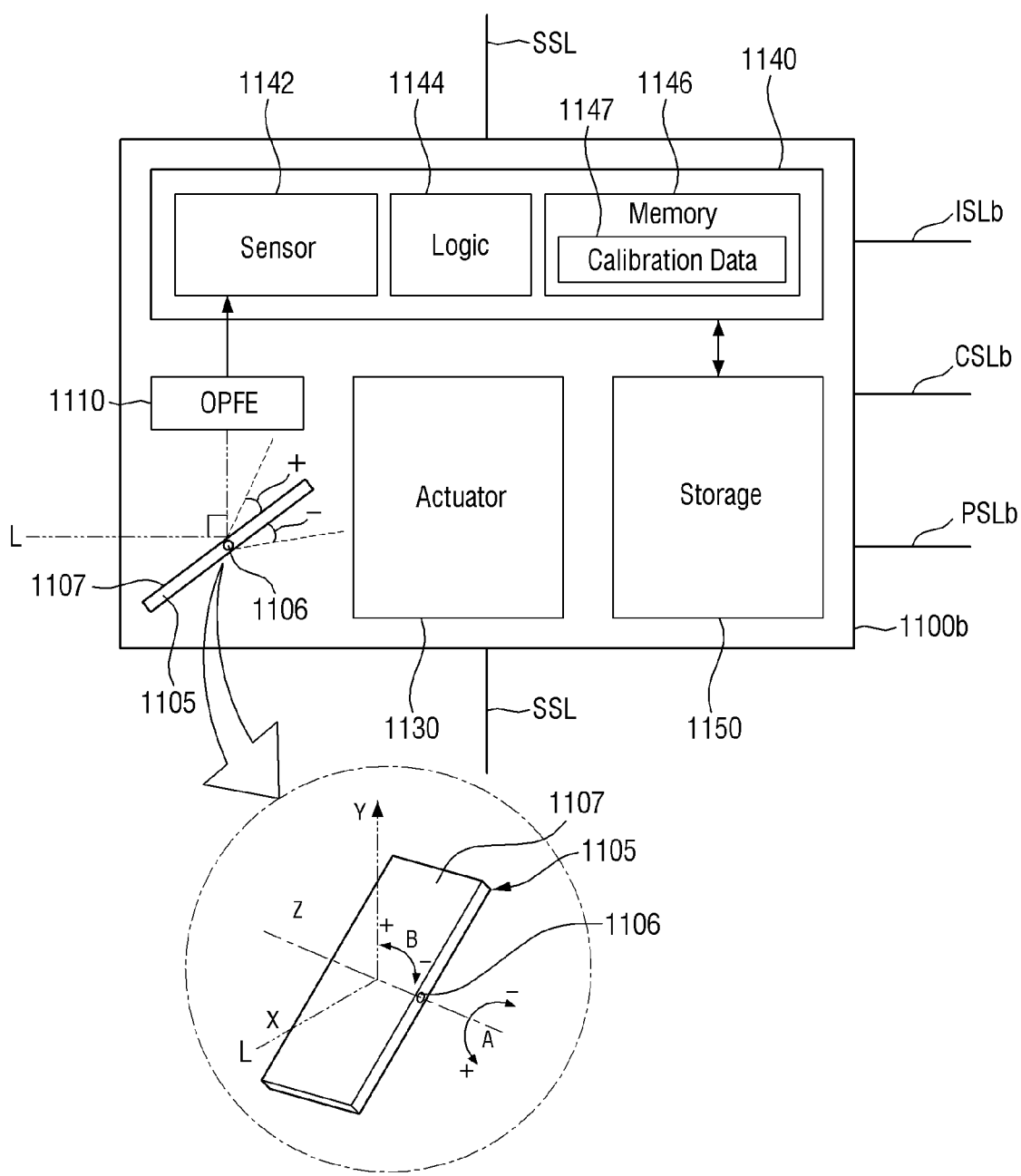
FIG. 19 is a detailed block diagram of a camera module of FIG. 18.

FIG. 18 is a block diagram showing an electronic device including a multi-camera module according to example embodiments of the present invention. FIG. 19 is a detailed block diagram of the camera module of FIG. 18.

Referring to FIGS. 18 and 19, an electronic device 1000 may include a camera module group 1100, an application processor 1200, a power management integrated circuits (PMIC) 1300, and an external memory 1400.

The camera module group 1100 may include a plurality of camera modules 1100a, 1100b and 1100c. FIG. 18 illustrates an example in which three camera modules 1100a, 1100b and 1100c are placed, however embodiments are not limited thereto. In example embodiments, the camera module group 1100 may be modified to include, for example, only two camera modules. Also, in example embodiments, the camera module group 1100 may be modified to include n (n is a natural number of 4 or more) camera modules.

Hereinafter, although a detailed configuration of the camera module 1100b will be described in more detail referring to FIG. 19, the following description may also be applicable to other camera modules 1100a and 1100c.

Referring to FIG. 19, a camera module 1100b may include a prism 1105, an optical path folding element (OPFE) 1110, an actuator 1130, an image sensing device 1140, and a storage 1150.

The prism 1105 may include a reflective surface 1107 of a light-reflecting material to deform the path of light L that is incident from the outside.

In example embodiments, the prism 1105 may change the path of light L incident in the first direction (X-axis direction) to a second direction (Y-axis direction) perpendicular to the first direction (X-axis direction). Further, the prism

1105 may rotate the reflective surface 1107 of the light-reflecting material in a direction A around a central axis 1106, or rotate the reflective surface 1107 around the central axis 1106 in a direction B to change the path of the light L incident in the first direction (X-axis direction) to the vertical second direction (Y-axis direction). At this time, the OPFE 1110 may also move in the third direction (Z-axis direction) perpendicular to the first direction (X-axis direction) and the second direction (Y-axis direction).

In example embodiments, as shown, although a maximum rotation angle of the prism 1105 in the direction A may be 15 degrees or less in a positive (+) direction A, and may be greater than 15 degrees in a negative (−) direction A, embodiments are not limited thereto.

In example embodiments, the prism 1105 may move around 20 degrees, or between 10 and 20 degrees, or between 15 and 20 degrees in the positive (+) or negative (−) direction B. Here, the moving angle may move at the same angle in positive (+) or negative (−) direction B, or may move to almost the similar angle in the range of about 1 degree.

In example embodiments, the prism 1105 may move the reflective surface 1106 of the light-reflecting material in a third direction (Z-axis direction) parallel to the extension direction of the central axis 1106.

The OPFE 1110 may include, for example, optical lenses including m (m is a natural number) groups. The m lenses may move in the second direction Y to change the optical zoom ratio of the camera module 1100b. For example, when a basic optical zoom ratio of the camera module 1100b is defined as Z, if them optical lenses included in the OPFE 1110 are moved, the optical zoom ratio of the camera module 1100b may be changed to the optical zoom ratio of 3Z or 5Z or higher.

The actuator 1130 may move the OPFE 1110 or an optical lens to a specific position. For example, the actuator 1130 may adjust the position of the optical lens so that the image sensor 1142 is located at the focal length of the optical lens for accurate sensing.

The image sensing device 1140 may include an image sensor 1142, a control logic 1144 and a memory 1146. The image sensor 1142 may sense the image to be sensed, using the light L provided through the optical lens. The control logic 1144 may control the overall operation of the camera module 1100b. For example, the control logic 1144 may control the operation of the camera module 1100b according to the control signal provided through the control signal line CSLb.

The memory 1146 may store information necessary for the operation of the camera module 1100b, such as calibration data 1147. The calibration data 1147 may include information necessary for the camera module 1100b to generate image data, using light L provided from the outside. The calibration data 1147 may include, for example, above-mentioned information on the degree of rotation, information on the focal length, information on the optical axis, and the like. If the camera module 1100b is provided in the form of a multi-state camera whose focal length changes depending on the position of the optical lens, the calibration data 1147 may include focal length values for each position (or for each state) of the optical lens 1147, and information about auto-focusing.

The storage 1150 may store the image data sensed through the image sensor 1142. The storage 1150 may be placed outside the image sensing device 1140, and may be provided in the form of being stacked with sensor chips constituting the image sensing device 1140. In example embodiments, the storage 1150 may be provided as electrically erasable programmable read-only memory (EEPROM). However, embodiments are not limited thereto.

Referring to FIGS. 18 and 19 together, in example embodiments, each of the plurality of camera modules 1100a, 1100b and 1100c may include an actuator 1130. Accordingly, each of the plurality of camera modules 1100a, 1100b and 1100c may include calibration data 1147 that are the same as or different from each other, depending on the operation of the actuator 1130 included therein.

In example embodiments, one camera module (e.g., 1100b) of the plurality of camera modules 1100a, 1100b and 1100c may be a folded lens type camera module including the prism 1105 and the OPFE 1110 described above, and the remaining camera modules (e.g., 1100a, 1100c) may be a vertical type camera module which does not include the prism 1105 and the OPFE 1110. However, embodiments are not limited thereto.

In example embodiments, one camera module (e.g., 1100c) of the plurality of camera modules 1100a, 1100b and 1100c may be a vertical type depth camera which extracts depth information, using, for example, infrared ray (IR). In this case, the application processor 1200 may merge the image data provided from such a depth camera with the image data provided from other camera module (e.g., 1100a or 1100b) to generate a three-dimensional depth image.

In example embodiments, at least two camera modules (e.g., 1100a, 1100b) among the plurality of camera modules 1100a, 1100b and 1100c may have different fields of view viewing angles. In this case, for example, although the optical lenses of at least two camera modules (for example, 1100a, 1100b) among the plurality of camera modules 1100a, 1100b and 1100c may be different from each other, embodiments are not limited thereto.

Also, in example embodiments, the fields of view of the plurality of camera modules 1100a, 1100b and 1100c may be different from each other. In this case, although the optical lenses included in each of the plurality of camera modules 1100a, 1100b and 1100c may be different from each other, embodiments are not limited thereto.

In example embodiments, each of the plurality of camera modules 1100a, 1100b and 1100c may be placed to be physically separated from each other. For example, an independent image sensor 1142 may be provided in each of the plurality of camera modules 1100a, 1100b and 1100c.

Referring to FIG. 18 again, the application processor 1200 may include an image signal processor 1210, a memory controller 1220, and an internal memory 1230. The application processor 1200 may be provided separate from the plurality of camera modules 1100a, 1100b and 1100c. For example, the application processor 1200 and the plurality of camera modules 1100a, 1100b and 1100c may be provided separately by separate semiconductor chips.

The image signal processor 1210 may include a plurality of sub-image processors 1212a, 1212b and 1212c, an image generator 1214, and a camera module controller 1216.

The image signal processor 1210 may include a plurality of sub-image processors 1212a, 1212b and 1212c corresponding to the number of the plurality of camera modules 1100a, 1100b and 1100c.

The image data generated from each of the camera modules 1100a, 1100b and 1100c may be provided to the corresponding sub-image processors 1212a, 1212b and 1212c through the image signal lines ISLa, ISLb and ISLc separated from each other. For example, the image data generated from the camera module 1100a is provided to the sub-image processor 1212a through the image signal line ISLa, the image data generated from the camera module 1100*b* is provided to the sub-image processor 1212*b* through the image signal line ISLb, and the image data generated from the camera module 1100*c* may be provided to the sub-image processor 1212*c* through the image signal line ISLc. Such an image data transmission may be performed using, for example, a camera serial interface (CSI) based on mobile industry processor interface (MIPI), embodiments are not limited thereto.

In example embodiments, one sub-image processor may be placed to correspond to a plurality of camera modules. For example, the sub-image processor 1212*a* and the sub-image processor 1212*c* are not provided separate from each other as shown, but may be provided by being integrated into a single sub-image processor. The image data provided from the camera module 1100*a* and the camera module 1100*c* may be selected through the selection element (e.g., a multiplexer) or the like, and then provided to the integrated sub-image processor.

The image data provided to each of the sub-image processors 1212*a*, 1212*b* and 1212*c* may be provided to the image generator 1214. The image generator 1214 may generate an output image, using the image data provided from the respective sub-image processors 1212*a*, 1212*b* and 1212*c* according to the image generating information or the mode signal.

Specifically, the image generator 1214 may merge at least example of the image data generated from the camera modules 1100*a*, 1100*b* and 1100*c* having different viewing angles according to the image generating information or the mode signal to generate an output image. Further, the image generator 1214 may generate an output image, by selecting any one of the image data generated from the camera modules 1100*a*, 1100*b* and 1100*c* having different viewing angles according to the image generating information or the mode signal.

In example embodiments, the image generating information may include a zoom signal (or zoom factor). Also, in example embodiments, the mode signal may be, for example, a signal based on the mode selected from the user.

When the image generating information is a zoom signal (zoom factor) and each of the camera modules 1100*a*, 1100*b* and 1100*c* have different fields of view (viewing angle), the image generator 1214 may perform different operations depending on the type of the zoom signal. For example, when the zoom signal is a first signal, the image data that is output from the camera module 1100*a* may be merged with the image data that is output from the camera module 1100*c*, and then the output image may be generated using the merged image signal and the image data that is not used for mergence and output from the camera module 1100*b*. When the zoom signal is a second signal different from the first signal, the image generator 1214 does not perform the image data mergence, and may generate the output image by selecting any one of the image data output from the respective camera modules 1100*a*, 1100*b* and 1100*c*. However, embodiments are not limited thereto, and the method of processing the image data may be modified as much as necessary.

In example embodiments, the image generator 1214 may receive a plurality of image data with different exposure times from at least one of the plurality of sub-image processors 1212*a*, 1212*b* and 1212*c*, and perform a high dynamic range (HDR) process on the plurality of image data, thereby generating merged image data with an increased dynamic range.

The camera module controller 1216 may provide control signals to each of the camera modules 1100*a*, 1100*b* and 1100*c*. The control signals generated from the camera module controller 1216 may be provided to the corresponding camera modules 1100*a*, 1100*b* and 1100*c* through the control signal lines CSLa, CSLb and CSLc separated from each other.

For example, one of the plurality of camera modules 1100*a*, 1100*b* and 1100*c* may be designated as a master camera (e.g., 1100*b*) and the remaining camera modules (e.g., 1100*a*, 1100*c*) may be designated as a slave camera 1100*b*, depending on the image generating information including the zoom signal or the mode signal. Such information is included in the control signal and may be provided to the corresponding camera modules 1100*a*, 1100*b* and 1100*c* through the control signal lines CSLa, CSLb and CSLc separated from each other.

The camera modules that operate as master and slave may be modified, depending on the zoom factor or the operating mode signal. For example, when the viewing angle of the camera module 1100*a* is wider than the viewing angle of the camera module 1100*b* and the zoom factor shows a low zoom ratio, the camera module 1100*b* may operate as a master and the camera module 1100*a* may operate as a slave. When the zoom factor shows a high zoom ratio, the camera module 1100*a* may operate as a master and the camera module 1100*b* may operate as a slave.

In example embodiments, the control signal provided from the camera module controller 1216 to each of the camera modules 1100*a*, 1100*b* and 1100*c* may include a sync enable signal. For example, when the camera module 1100*b* is the master camera and the camera modules 1100*a* and 1100*c* are slave cameras, the camera module controller 1216 may transmit a sync enable signal to the camera module 1100*b*. The camera module 1100*b*, which has received such a sync enable signal, generates a sync signal on the basis of the received sync enable signal, and may provide the generated sync signal to the camera modules 1100*a* and 1100*c* through the sync signal line SSL. The camera module 1100*b* and the camera modules 1100*a* and 1100*c* are synchronized with such a sync signal, and may transmit the image data to the application processor 1200.

In example embodiments, the control signal provided from the camera module controller 1216 to the plurality of camera modules 1100*a*, 1100*b* and 1100*c* may include mode information according to the mode signal. The plurality of camera modules 1100*a*, 1100*b* and 1100*c* may operate in the first operating mode or the second operating mode in relation to the sensing speed, on the basis of the mode information.

The plurality of camera modules 1100*a*, 1100*b* and 1100*c* may generate an image signal at the first speed in the first operating mode (for example, generate an image signal at the first frame rate), encode the image single at a second speed higher than the first speed (e.g., encode an image signal of a second frame rate higher than the first frame rate), and transmit the encoded image signal to the application processor 1200. At this time, the second speed may be equal to or less than 30 times the first speed.

The application processor 1200 stores the received image signal that is the encoded image signal, in a memory 1230 provided inside or a storage 1400 outside the application processor 1200. The application processor 1200 may then read and decode the encoded image signal from the memory 1230 or the storage 1400, and display the image data generated based on the decoded image signal. For example, the corresponding sub-processors among the plurality of sub-processors 1212a, 1212b and 1212c of the image signal processor 1210 may perform decoding and may also perform image processing on the decoded image signal.

The plurality of camera modules 1100a, 1100b and 1100c may generate an image signal at a third speed lower than the first speed in the second operating mode (e.g., generates an image signal of a third frame rate lower than the first frame rate), and transmit the image signal to the application processor 1200. The image signal provided to the application processor 1200 may be a non-encoded signal. The application processor 1200 may perform image processing on the received image signal or store the image signal in the memory 1230 or the storage 1400.

The PMIC 1300 may supply power, for example, power supply voltage, to each of the plurality of camera modules 1100a, 1100b and 1100c. For example, the PMIC 1300 may supply the first power to the camera module 1100a through the power signal line PSLa, supply the second power to the camera module 1100b through the power signal line PSLb, and supply the third power to the camera module 1100c through the power signal line PSLc, under the control of the application processor 1200.

The PMIC 1300 may generate power corresponding to each of the plurality of camera modules 1100a, 1100b and 1100c and adjust the level of power, in response to the power control signal PCON from the application processor 1200. The power control signal PCON may include a power adjustment signal for each operating mode of the plurality of camera modules 1100a, 1100b and 1100c. For example, the operating mode may include a low power mode, and at this time, the power control signal PCON may include information about the camera module that operates in the low power mode and the power level to be set. The levels of powers provided to each of the plurality of camera modules 1100a, 1100b and 1100c may be the same as or different from each other. Also, the power level may be changed dynamically.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular example embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims and their equivalents.

What is claimed is:

1. An image sensor comprising:
   a substrate;
   an element separation film provided on the substrate in a mesh shape;
   a plurality of pixel regions formed by the element separation film, the plurality of pixel regions comprising a first pixel region and a second pixel region that is adjacent to the first pixel region, the element separation film being interposed between the first pixel region and the second pixel region;
   a first lens provided to extend along the first pixel region and the second pixel region;
   a first color filter configured to transmit light focused by the first lens to the first pixel region and the second pixel region; and
   a color filter grid forming a region in which the first color filter is provided, and only partially overlapping the first pixel region and the second pixel region in a vertical direction.

2. The image sensor of claim 1, wherein the plurality of pixel regions further comprises a third pixel region formed by the element separation film and provided adjacent to the first pixel region, the element separation film being interposed between the third pixel region and the first pixel region, and
   wherein the image sensor further comprises:
      a second lens provided on the third pixel region; and
      a second color filter configured to transmit light focused by the second lens to the third pixel region, the second color filter being provided in a region formed by the color filter grid.

3. The image sensor of claim 2, wherein the color filter grid overlaps the element separation film in the vertical direction and does not overlap the third pixel region in the vertical direction.

4. The image sensor of claim 2, wherein a peak of the first lens with respect to the substrate is higher than a peak of the second lens with respect to the substrate.

5. The image sensor of claim 1, wherein the first color filter is a green color filter.

6. The image sensor of claim 1, wherein the plurality of pixel regions further comprise a fourth pixel region and a fifth pixel region provided adjacent to the fourth pixel region, the element separation film being interposed between the fourth pixel region and the fifth pixel region, and
   wherein the image sensor further comprises:
      a third lens provided on the fourth pixel region and the fifth pixel region; and
      a third color filter configured to transmit light focused by the third lens to the fourth pixel region and the fifth pixel region.

7. The image sensor of claim 6, wherein the third color filter is provided adjacent to the first color filter, the color filter grid being interposed between the third color filter and the first color filter.

8. The image sensor of claim 1, wherein the color filter grid comprises a low refractive index material layer.

9. The image sensor of claim 8, wherein the color filter grid comprises a lower metal layer provided below a bottom surface of the low refractive index material layer.

10. The image sensor of claim 9, wherein the lower metal layer includes tungsten (W), and
    wherein a thickness of the lower metal layer ranges from 3 nm to 100 nm.

11. An image sensor comprising:
    a substrate comprising a first pixel region and a second pixel region provided adjacent to the first pixel region, an element separation film being interposed between the first pixel region and the second pixel region;
    a first photoelectric conversion element provided on the substrate in the first pixel region;
    a second photoelectric conversion element provided on the substrate in the second pixel region;
    a super phase detection (PD) lens provided to extend along the first pixel region and the second pixel region;
    a first color filter configured to transmit light focused by the super PD lens to the first pixel region and the second pixel region; and a color filter grid forming a region in which the first color filter is provided, and only partially overlapping the first pixel region and the second pixel region in a vertical direction.

12. The image sensor of claim 11, wherein the element separation film is provided on the substrate in a mesh shape,
wherein the substrate further comprises a third pixel region formed by the element separation film and provided adjacent to the first pixel region, the element separation film being interposed between the third pixel region and the first pixel region, and
wherein the image sensor further comprises
a lens provided on the third pixel region; and
a second color filter configured to transmit light focused by the lens to the third pixel region, the second color filter being provided in a region formed by the color filter grid.

13. The image sensor of claim 12, wherein the color filter grid overlaps the element separation film in the vertical direction, and does not overlap the third pixel region in the vertical direction.

14. The image sensor of claim 11, wherein the color filter grid comprises a low refractive index material layer.

15. The image sensor of claim 14, wherein the color filter grid comprises a lower metal layer provided below a bottom surface of the low refractive index material layer.

16. The image sensor of claim 15, wherein the lower metal layer includes tungsten (W), and
wherein a thickness of the lower metal layer ranges from 3 nm to 100 nm.

17. An image sensing system comprising:
an image sensor configured to output an image signal; and
an image signal processor connected to the image sensor, the image signal processor being configured to receive and process the image signal,
wherein the image sensor comprises
a substrate;
an element separation film provided on the substrate in a mesh shape;
a plurality of pixel regions formed by the element separation film, and the plurality of pixel regions comprising a first pixel region, a second pixel region, and a third pixel region provided adjacent to each other in a horizontal direction;
a first lens provided to extend along the first pixel region and the second pixel region;
a second lens provided on the third pixel region;
a first color filter configured to transmit light focused by the first lens to the first pixel region and the second pixel region;
a second color filter configured to transmit light focused by the second lens to the third pixel region; and
a color filter grid forming a region in which the first color filter is provided, the color filter grid only partially overlapping the first pixel region and the second pixel region in a vertical direction.

18. The image sensor of claim 17, wherein the color filter grid overlaps the element separation film in the vertical direction, and does not overlap the third pixel region in the vertical direction.

19. The image sensor of claim 17, wherein a peak of the first lens with respect to the substrate is higher than a peak of the second lens with respect to the substrate.

20. The image sensor of claim 17, wherein the color filter grid comprises a low refraction index material layer.

* * * * *